(12) United States Patent
Shinagawa et al.

(10) Patent No.: US 10,074,658 B2
(45) Date of Patent: Sep. 11, 2018

(54) NON-VOLATILE SRAM MEMORY CELL AND NON-VOLATILE SEMICONDUCTOR STORAGE DEVICE

(71) Applicant: FLOADIA CORPORATION, Kodaira-shi, Tokyo (JP)

(72) Inventors: Yutaka Shinagawa, Kodaira (JP); Yasuhiro Taniguchi, Kodaira (JP); Hideo Kasai, Kodaira (JP); Ryotaro Sakurai, Kodaira (JP); Yasuhiko Kawashima, Kodaira (JP); Tatsuro Toya, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 15/561,774

(22) PCT Filed: Mar. 18, 2016

(86) PCT No.: PCT/JP2016/058843
§ 371 (c)(1),
(2) Date: Sep. 26, 2017

(87) PCT Pub. No.: WO2016/158529
PCT Pub. Date: Oct. 6, 2016

(65) Prior Publication Data
US 2018/0083014 A1  Mar. 22, 2018

(30) Foreign Application Priority Data
Mar. 27, 2015 (JP) .................................. 2015-065956

(51) Int. Cl.
*G11C 14/00* (2006.01)
*H01L 27/11* (2006.01)
(Continued)

(52) U.S. Cl.
CPC ........ *H01L 27/1104* (2013.01); *G11C 11/412* (2013.01); *H01L 29/788* (2013.01); *H01L 29/792* (2013.01)

(58) Field of Classification Search
CPC .................................................. G11C 14/0063
(Continued)

(56) References Cited

U.S. PATENT DOCUMENTS 5,488,579 A * 1/1996 Sharma .................. H01L 27/11
257/316
2002/0074594 A1  6/2002 Katayama et al.
(Continued)

FOREIGN PATENT DOCUMENTS

JP   2002-164449 A   6/2002
JP   2005-142354 A   6/2005
(Continued)

OTHER PUBLICATIONS

International Search Report issued in Patent Application No. PCT/JP2016/058843 dated Jun. 7, 2016.
(Continued)

*Primary Examiner* — Hoai V Ho
(74) *Attorney, Agent, or Firm* — Pearne & Gordon LLP

(57) ABSTRACT

A non-volatile SRAM memory cell and a non-volatile semiconductor memory device capable of programming SRAM data in a SRAM to a non-volatile memory unit through fast operation of the SRAM are disclosed. A non-volatile semiconductor memory device can achieve reduction in a voltage necessary for a programming operation to program SRAM data to the non-volatile memory unit. Thus, a first access transistor, a second access transistor, a first load transistor, a second load transistor, a first drive transistor, and a second drive transistor included in the SRAM connected with the non-volatile memory unit can each include (Continued)

a gate insulating film having a thickness less than or equal to 4 nm, which achieves fast operation of the SRAM at a lower power supply voltage.

9 Claims, 5 Drawing Sheets

(51) Int. Cl.
 *G11C 11/412* (2006.01)
 *H01L 29/788* (2006.01)
 *H01L 29/792* (2006.01)
(58) Field of Classification Search
 USPC .................................................. 365/185.08
 See application file for complete search history.

(56) References Cited

U.S. PATENT DOCUMENTS

2006/0023503 A1 2/2006 Lee
2014/0175533 A1 6/2014 Kwon

FOREIGN PATENT DOCUMENTS

| | | |
|---|---|---|
| JP | 2010-278314 A | 12/2010 |
| JP | 2011-129816 A | 6/2011 |
| WO | 2006-019653 A2 | 2/2006 |

OTHER PUBLICATIONS

Written Opinion issued in Patent Application No. PCT/JP2016/058843 dated Jun. 7, 2016.

Article: Wikipedia, Static Random-access memory, http://en.wikipedia.org/wiki/Static_random-access_memory, May 21, 2015, pp. 1-5.

* cited by examiner

|  | MGL | DGL | SGL | SL | SNT/SNB | WL1 |
|---|---|---|---|---|---|---|
| Program(sram to flash) | 12 | VDD | 0 | 0 | 0 or VDD | 0 |
| Erase(reset data in flash) | -12 | 0 | 0 | 0 | Don't care | 0 |
| Write(external data to sram) | 0 | 0 | 0 | 0 | Don't care | VDD/0 |
| Read(output sram data) | 0 | 0 | 0 | 0 | 0 or VDD | VDD/0 |

NON-VOLATILE SRAM MEMORY CELL AND NON-VOLATILE SEMICONDUCTOR STORAGE DEVICE

TECHNICAL FIELD

The present invention relates to a non-volatile SRAM memory cell and a non-volatile semiconductor memory device.

BACKGROUND ART

A static random access memory (SRAM) has been importantly needed to achieve fast processing of large-volume signals such as sound and image signals along with recent wide spread of an electric instrument such as a smartphone (for example, refer to Non Patent Literature 1). Typically, the SRAM is required to achieve fast operation with reduced area and electric consumption, and recent development has been made on a novel circuit configuration. As a volatile memory, the SRAM is required to store external data written to a storage node, even after electrical power supply has stopped. Thus, it is required to program SRAM data to a non-volatile memory unit capable of storing data after electrical power is stopped, and read data from the non-volatile memory unit to the storage node after electrical power supply has started again.

CITATION LIST

Non Patent Literature

Non Patent Literature 1: "Static Random Access Memory", Wikipedia, [online], the Internet (URL: http://ja.wikipedia.org/wiki/Static_Random_Access_Memory)

SUMMARY OF INVENTION

Technical Problem

A typical non-volatile memory unit has a large voltage difference between a voltage needed for a data programming operation and a voltage needed for a non-programming operation in which data programming is not performed. Accordingly, an SRAM configured to communicate data with such a conventional non-volatile memory unit requires application of a large voltage to SRAM in accordance with the voltages needed for the data programming operation at the non-volatile memory unit and the non-programming operation. Thus, a transistor in the SRAM provided to the non-volatile memory unit includes a gate insulating film having a large thickness, which makes it difficult to operate the SRAM fast.

The present invention has been made under such circumstances and aims at providing a non-volatile SRAM memory cell and a non-volatile semiconductor memory device that achieve fast operation of an SRAM capable of programming data to a non-volatile memory unit.

Solution to Problem

To solve the above-describe problem, a non-volatile SRAM memory cell according to the present invention includes a static random access memory (SRAM) and a non-volatile memory unit. The SRAM includes a first load transistor, a first drive transistor, a first storage node between the first load transistor and the first drive transistor and includes a second load transistor, a second drive transistor, and a second storage node between the second load transistor and the second drive transistor. One end of the first load transistor is connected with one end of the first drive transistor. One end of the second load transistor is connected with one end of the second drive transistor. The other end of each of the first load transistor and the second load transistor is connected with a power supply line. The other end of each of the first drive transistor and the second drive transistor each is connected with a reference voltage line. The non-volatile memory unit includes a first memory cell and a second memory cell. The first memory cell includes a first drain side select transistor, a first source side select transistor, a first memory transistor between the first drain side select transistor and the first source side select transistor connected in series. The first drain side select transistor has one end connected with the first storage node. The second memory cell includes a second drain side select transistor, a second source side select transistor, and a second memory transistor between the second drain side select transistor and the second source side select transistor connected in series. The second drain side select transistor has one end connected with the second storage node. The first memory transistor and the second memory transistor each includes a memory gate electrode and a charge storage layer into which charge is injected by a quantum tunneling effect that occurs in accordance with a charge storage gate voltage applied to the memory gate electrode. The first source side select transistor and the second source side select transistor each have one end connected with a source line. The SRAM includes a first access transistor and a second access transistor. The first access transistor has one end connected with gates of the second load transistor and the second drive transistor and with the first storage node, the other end connected with a complementary first bit line, and a gate connected with a word line. The second access transistor has one end connected with gates of the first load transistor and the first drive transistor and with the second storage node, the other end connected with a complementary second bit line, and a gate connected with the word line. The first access transistor, the second access transistor, the first load transistor, the second load transistor, the first drive transistor, and the second drive transistor each include a gate insulating film having a thickness less than or equal to 4 nm.

A non-volatile semiconductor memory device according to the present invention includes the above-described non-volatile SRAM memory cells arranged in a matrix of rows and columns.

Advantageous Effects of Invention

According to the present invention, when data is to be programmed from the SRAM to the non-volatile memory unit, the first source side select transistor and the second source side select transistor are turned off while one of the first drain side select transistor and the second drain side select transistor is turned off based on a voltage difference between the first storage node and the second storage node.

Accordingly, in the first memory transistor or the second memory transistor connected with one of the first drain side select transistor and the second drain side select transistor, which is turned off, in the non-volatile SRAM memory cell, the potential of a memory well is increased based on the charge storage gate voltage to reduce a voltage difference between the memory gate electrode and a surface of the memory well, thereby preventing charge injection into the charge storage layer. Simultaneously, the voltage of the first storage node or the second storage node corresponding to the other of the first drain side select transistor and the second drain side select transistor, which is turned on, is applied to one of the first memory transistor and the second memory transistor to increase the voltage difference between the memory gate electrode and the surface of the memory well, thereby achieving charge injection into the charge storage layer by the quantum tunneling effect.

In this manner, data can be programmed from the SRAM to the non-volatile memory unit based on the voltages of the first storage node and the second storage node irrespective of the charge storage gate voltage, only by turning on and off the first drain side select transistor, the first source side select transistor, the second drain side select transistor, and the second source side select transistor in the non-volatile SRAM memory cell.

Thus, a voltage value at each site of the non-volatile SRAM memory cell can be reduced to allow the first access transistor, the second access transistor, the first load transistor, the second load transistor, the first drive transistor, and the second drive transistor included in the SRAM connected with the non-volatile memory unit to each include a gate insulating film having thickness less than or equal to 4 nm in accordance with the voltage reduction. Accordingly, the SRAM can be operated fast at a lower power supply voltage, thereby achieving fast operation of the SRAM capable of programming data to the non-volatile memory unit.

DESCRIPTION OF EMBODIMENTS

Figure 1:
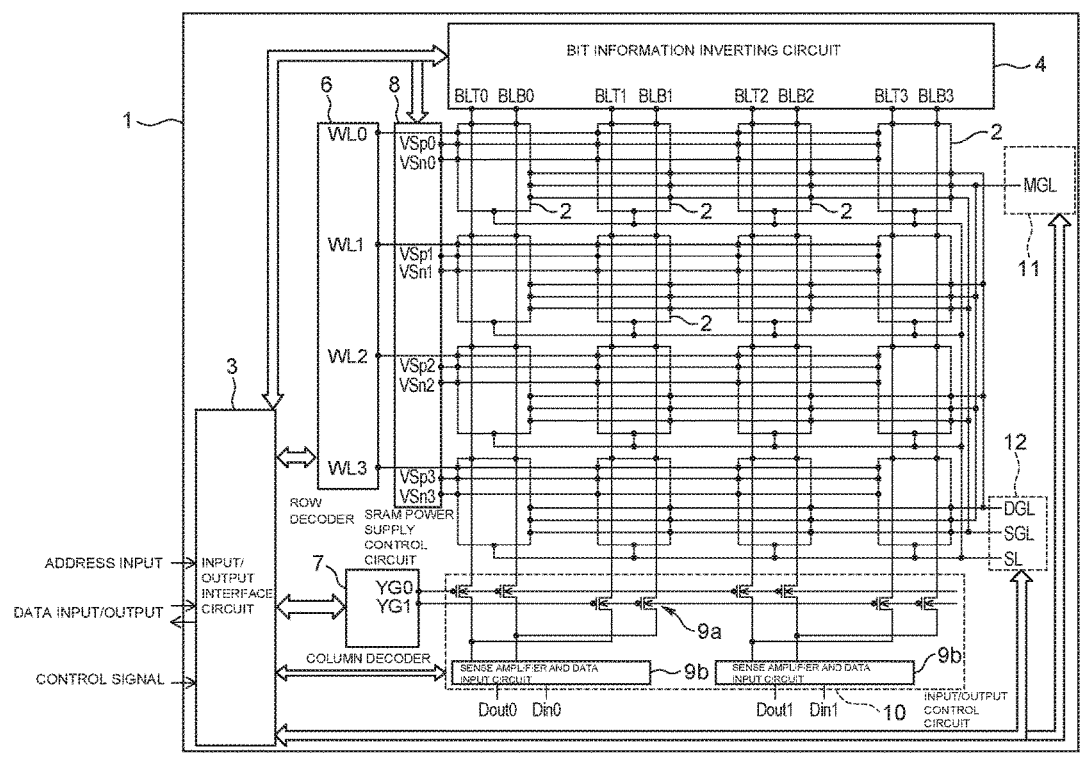
FIG. 1 is a schematic view illustrating a circuit configuration of a non-volatile semiconductor memory device according to the present invention.

Hereinafter, embodiments of the present invention will be described in the following order.
1. Entire configuration of non-volatile semiconductor memory device
2. Configuration of non-volatile SRAM memory cell
3. External data writing operation to write external data to SRAM
4. Reading operation to read SRAM data from SRAM
5. Programming operation to write SRAM data in SRAM to non-volatile memory unit 5-1. Prevention of charge injection into charge storage layer when no channel layer is formed
5-1-1. carrier removal operation performed before programming operation
5-1-2. Programming operation after carrier removal operation
5-2. Prevention of charge injection into charge storage layer when channel layer is formed
6. Memory data erasing operation at non-volatile memory unit
7. Memory data programming operation to program memory data in non-volatile memory unit to SRAM
8. Operations and effects
9. Other embodiments

(1) Entire Configuration of Non-Volatile Semiconductor Memory Device

In FIG. 1, reference numeral 1 denotes a non-volatile semiconductor memory device according to the present invention including a plurality of non-volatile SRAM memory cells 2 arranged in a matrix of rows and columns. The non-volatile semiconductor memory device 1 receives an address input and a control signal through an input/output interface circuit 3, and communicates data with an external circuit (not illustrated) through the input/output interface circuit 3. The input/output interface circuit 3 generates operation signals based on such an address input, a data input, and a control signal. The input/output interface circuit 3 then sends the operation signals to a bit information inverting circuit 4, a row decoder 6, a column decoder 7, an SRAM power control circuit 8, an input/output control circuit 10, a memory gate voltage control circuit 11, and a select gate voltage and source voltage control circuit 12 as appropriate. Accordingly, the bit information inverting circuit 4, the row decoder 6, the column decoder 7, the SRAM power control circuit 8, the input/output control circuit 10, the memory gate voltage control circuit 11, and the select gate voltage and source voltage control circuit 12 are controlled based on the operation signals from the input/output interface circuit 3 to execute operations.

The row decoder 6 includes a plurality of word lines WL0, WL1, WL2, and WL3 each connected to a plurality of the non-volatile SRAM memory cells 2. With this configuration, the row decoder 6 applies a predetermined voltage to the non-volatile SRAM memory cells 2 of each of the word lines WL0, WL1, WL2, and WL3 based on a row address included in an operation signal. The column decoder 7 is connected with the input/output control circuit 10 through wires YG0 and YG1 to turn on and off a transistor 9a provided to the input/output control circuit 10.

In the input/output control circuit 10, a read bit voltage from any one of the non-volatile SRAM memory cells 2 arranged in the matrix is detected at a sense amplifier and data input circuit 9b by turning on and off a pair of the transistors 9a provided for each column of the non-volatile SRAM memory cells 2. For example, when a pair of the transistors 9a connected with a pair of a complementary first bit line BLT1 and a complementary second bit line BLB1 are turned on, the sense amplifier and data input circuit 9b detects a voltage difference between the complementary first bit line BLT1 and the complementary second bit line BLB1. Upon the detection, the sense amplifier and data input circuit 9b determines one of the complementary first bit line BLT1 and the complementary second bit line BLB1 at a higher voltage to be at a "High" level voltage, and determines the other of the complementary second bit line BLB1 and the complementary first bit line BLT1 at a lower voltage to be at a "Low" level voltage.

The bit information inverting circuit 4 is connected with a pair of a complementary first bit line BLT0 (BLT1, BLT2, or BLT3) and a complementary second bit line BLB0 (BLB1, BLB2, or BLB3). A voltage is applied to the non-volatile SRAM memory cells 2 at each column through the complementary first bit line BLT0 (BLT1, BLT2, or BLT3) and the complementary second bit line BLB0 (BLB1, BLB2, or BLB3).

The bit information inverting circuit 4 reads "High" level and "Low" level of an SRAM (to be described later with reference to FIG. 2) included in the non-volatile SRAM memory cells 2, inverts the logic thereof through logic inversion processing to interchange the "High" level and the "Low" level, and programs the inverted level as inverted data to the SRAM.

In the present embodiment, the bit information inverting circuit 4 and the sense amplifier and data input circuit 9b are separately provided, but the present invention is not limited thereto. For example, the bit information inverting circuit 4 may be disposed in the sense amplifier and data input circuit 9b to read information on the "High" level and "Low" level of each non-volatile SRAM memory cell 2 through a sense amplifier, invert the logic of the information, and program the inverted information as inverted data to the SRAM again.

The SRAM power control circuit 8 is connected with a plurality of power supply lines VSp0, VSp1, VSp2, and VSp3 and a plurality of reference voltage lines VSn0, VSn1, VSn2, and VSn3. A plurality of the non-volatile SRAM memory cells 2 are connected with a pair of the power supply line VSp0 (VSp1, VSp2, or VSp3) and the reference voltage line VSn0 (VSn1, VSn2, or VSn3). With this configuration, the SRAM power control circuit 8 uniformly applies a power supply voltage VDD to the non-volatile SRAM memory cells 2 corresponding to each of the power supply lines VSp0, VSp1, VSp2, and VSp3 by applying the power supply voltage VDD to the power supply line. The SRAM power control circuit 8 uniformly applies a voltage of 0 V to a plurality of the non-volatile SRAM memory cells 2 corresponding to each the reference voltage lines VSn0, VSn1, VSn2, and VSn3.

In the present embodiment, the memory gate voltage control circuit 11 is connected with a memory gate line MGL shared by all non-volatile SRAM memory cells 2. A predetermined voltage is uniformly applied to all non-volatile SRAM memory cells 2 through the memory gate line MGL. In the present embodiment, a common drain side select gate line DGL, a common source side select gate line SGL, and a common source line SL are shared by all non-volatile SRAM memory cells 2 of the non-volatile semiconductor memory device 1. The drain side select gate line DGL, the source side select gate line SGL, and the source line SL are connected with the select gate voltage and source voltage control circuit 12. The select gate voltage and source voltage control circuit 12 uniformly applies a predetermined voltage to all non-volatile SRAM memory cells 2 through each of the drain side select gate line DGL, the source side select gate line SGL, and the source line SL.

(2) Configuration of Non-Volatile SRAM Memory Cell

Figure 2:
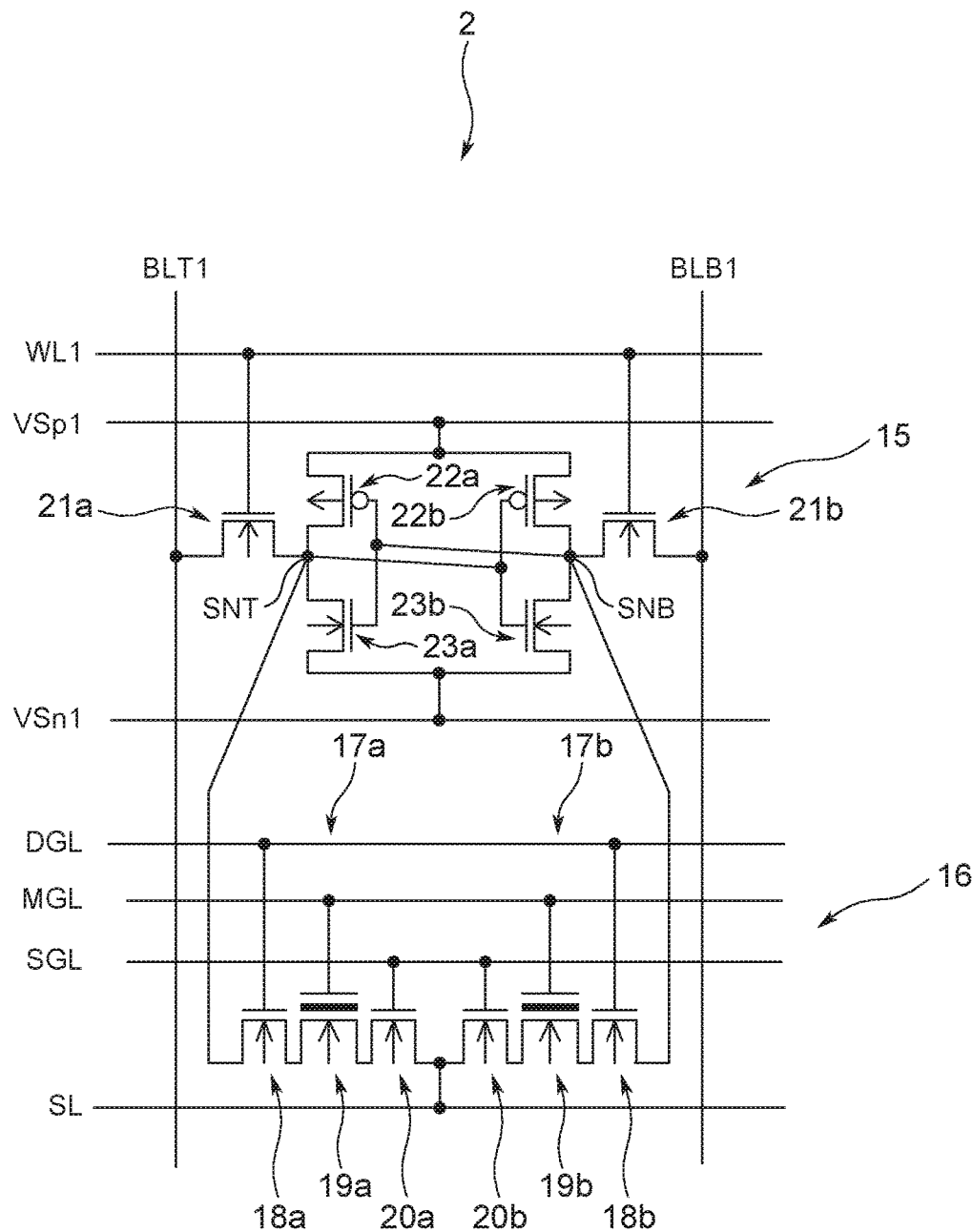
FIG. 2 is a schematic view illustrating a circuit configuration of a non-volatile SRAM memory cell.

The following describes the non-volatile SRAM memory cells 2 provided to the non-volatile semiconductor memory device 1. The non-volatile SRAM memory cells 2 arranged in the matrix have identical configurations, and thus the description will be made on, for example, the non-volatile SRAM memory cell 2 on the second row and the second column (at an intersection between the complementary first bit line BLT1 and the complementary second bit line BLB1 on the second column, and the word line WL1 on the second row). As illustrated in FIG. 2, each non-volatile SRAM memory cell 2 includes a SRAM 15 and a non-volatile memory unit 16 connected with a first storage node SNT and a second storage node SNB of the SRAM 15.

The SRAM 15 includes six MOS transistors of a first access transistor 21a and a second access transistor 21b as N-type metal-oxide-semiconductor (MOS) transistors, a first load transistor 22a and a second load transistor 22b as P-type MOS transistors, and a first drive transistor 23a and a second drive transistor 23b as N-type MOS transistors.

In the SRAM 15, one end of the first load transistor 22a is connected with one end of the first drive transistor 23a. The SRAM 15 includes the first storage node SNT between the first load transistor 22a and the first drive transistor 23a connected in series. In the SRAM 15, one end of the second load transistor 22b is connected with one end of the second drive transistor 23b. The SRAM 15 includes the second storage node SNB between the second load transistor 22b and the second drive transistor 23b connected in series. The other ends of the first load transistor 22a and the second load transistor 22b are connected with the power supply line VSp1, and the other ends of the first drive transistor 23a and the second drive transistor 23b are connected with the reference voltage line VSn1.

The first access transistor 21a has one end connected with the first storage node SNT and gates of the second load transistor 22b and the second drive transistor 23b, and has the other end connected with the complementary first bit line BLT1. The second access transistor 21b has one end connected with the second storage node SNB and gates of the first load transistor 22a and the first drive transistor 23a, and has the other end connected with the complementary second bit line BLB1.

The gates of the first access transistor 21a and the second access transistor 21b are connected with the word line WL1 in common. The first access transistor 21a is turned on and off in accordance with a voltage difference between the complementary first bit line BLT1 and the word line WL1 and a voltage difference between the first storage node SNT and the word line WL1. The second access transistor 21b is turned on and off in accordance with a voltage difference between the complementary second bit line BLB1 and the word line WL1 and a voltage difference between the second storage node SNB and the word line WL1.

Through an external data writing operation to be described later, external data can be written to the SRAM 15 having the above-described configuration through application of the external data to the first storage node SNT and the second storage node SNB as a "High" level or "Low" level voltage. The first storage node SNT and the second storage node SNB store this external data as SRAM data.

The non-volatile memory unit 16 connected with the SRAM 15 includes a first memory cell 17a and a second memory cell 17b. The first memory cell 17a and the second memory cell 17b serve as a two-cell/one-bit complementary cell. In the non-volatile memory unit 16, the first storage node SNT on the one side of the SRAM 15 is connected with one end of a first drain side select transistor 18a in the first memory cell 17a, and the second storage node SNB on the other side of the SRAM 15 is connected with one end of a second drain side select transistor 18b in the second memory cell 17b.

In the present embodiment, the first memory cell 17a includes the first drain side select transistor 18a as an N-type MOS transistor, a first source side select transistor 20a as an N-type MOS transistor, and a first memory transistor 19a as an N-type transistor connected in series with the other end of the first drain side select transistor 18a and the other end of the first source side select transistor 20a. The first memory transistor 19a is provided with a charge storage layer surrounded by an insulating member.

Similarly, the second memory cell 17b includes the second drain side select transistor 18b as an N-type MOS transistor, a second source side select transistor 20b as an N-type MOS transistor, and a second memory transistor 19b as an N-type transistor connected in series with the other end of the second drain side select transistor 18b and the other end of the second source side select transistor 20b. The second memory transistor 19b is provided with a charge storage layer surrounded by an insulating member.

The common drain side select gate line DGL is connected with gates of the first drain side select transistor 18a and the second drain side select transistor 18b of the non-volatile memory unit 16. Accordingly, an identical gate voltage can be applied to the gates of the first drain side select transistor 18a and the second drain side select transistor 18b through the drain side select gate line DGL in the non-volatile memory unit 16. The first drain side select transistor 18a and the second drain side select transistor 18b are configured to be each turned on and off based on a voltage difference between the gate and one end thereof.

When turned on, the first drain side select transistor 18a electrically connects the first storage node SNT of the SRAM 15, which is connected with the one end of the first drain side select transistor 18a, and one end of the first memory transistor 19a, which is connected with the other end of the first drain side select transistor 18a. When turned off, the first drain side select transistor 18a blocks the electrical connection between the first storage node SNT and the first memory transistor 19a.

Similarly, when turned on, the second drain side select transistor 18b electrically connects the second storage node SNB of the SRAM 15, which is connected with the one end of the second drain side select transistor 18b, and one end of the second memory transistor 19b, which is connected with the other end of the second drain side select transistor 18b. When turned off, the second drain side select transistor 18b blocks the electrical connection between the second storage node SNB and the second memory transistor 19b.

In each non-volatile SRAM memory cell 2 having such a configuration, the electrical connection between the SRAM 15 and the non-volatile memory unit 16 can be blocked by the first drain side select transistor 18a and the second drain side select transistor 18b. Thus, at the external data writing operation to the SRAM 15 or a reading operation of the SRAM data stored in the SRAM 15, the non-volatile memory unit 16 can be electrically separated from the SRAM 15 by turning off the first drain side select transistor 18a and the second drain side select transistor 18b. Accordingly, the SRAM 15 can be used as a typical SRAM.

The common source side select gate line SGL is connected with gates of the first source side select transistor 20a and the second source side select transistor 20b. An identical gate voltage is applied to each gate through the source side select gate line SGL. The common source line SL is connected with one end of the first source side select transistor 20a and one end of the second source side select transistor 20b. An identical source voltage is applied to each one end through the source line SL.

When turned on, the first source side select transistor 20a having such a configuration electrically connects the source line SL connected with the one end of the first source side select transistor 20a, and the other end of the first memory transistor 19a connected with the other end of the first source side select transistor 20a. When turned off, the first source side select transistor 20a blocks the electrical connection between the source line SL and the first memory transistor 19a.

Similarly, when turned on, the second source side select transistor 20b electrically connects the source line SL connected with the one end of the second source side select transistor 20b, and the other end of the second memory transistor 19b connected with the other end of the second source side select transistor 20b. When turned off, the second source side select transistor 20b blocks the electrical connection between the source line SL and the second memory transistor 19b.

The memory gate line MGL is connected with memory gate electrodes of the first memory transistor 19a and the second memory transistor 19b. An identical memory gate voltage is uniformly applied to each memory gate electrode through the memory gate line MGL. In each of the first memory transistor 19a and the second memory transistor 19b, a large voltage difference between the memory gate electrode and a memory well facing the memory gate electrode causes a quantum tunneling effect, thereby injecting charge in the memory well to the charge storage layer.

Figure 3:
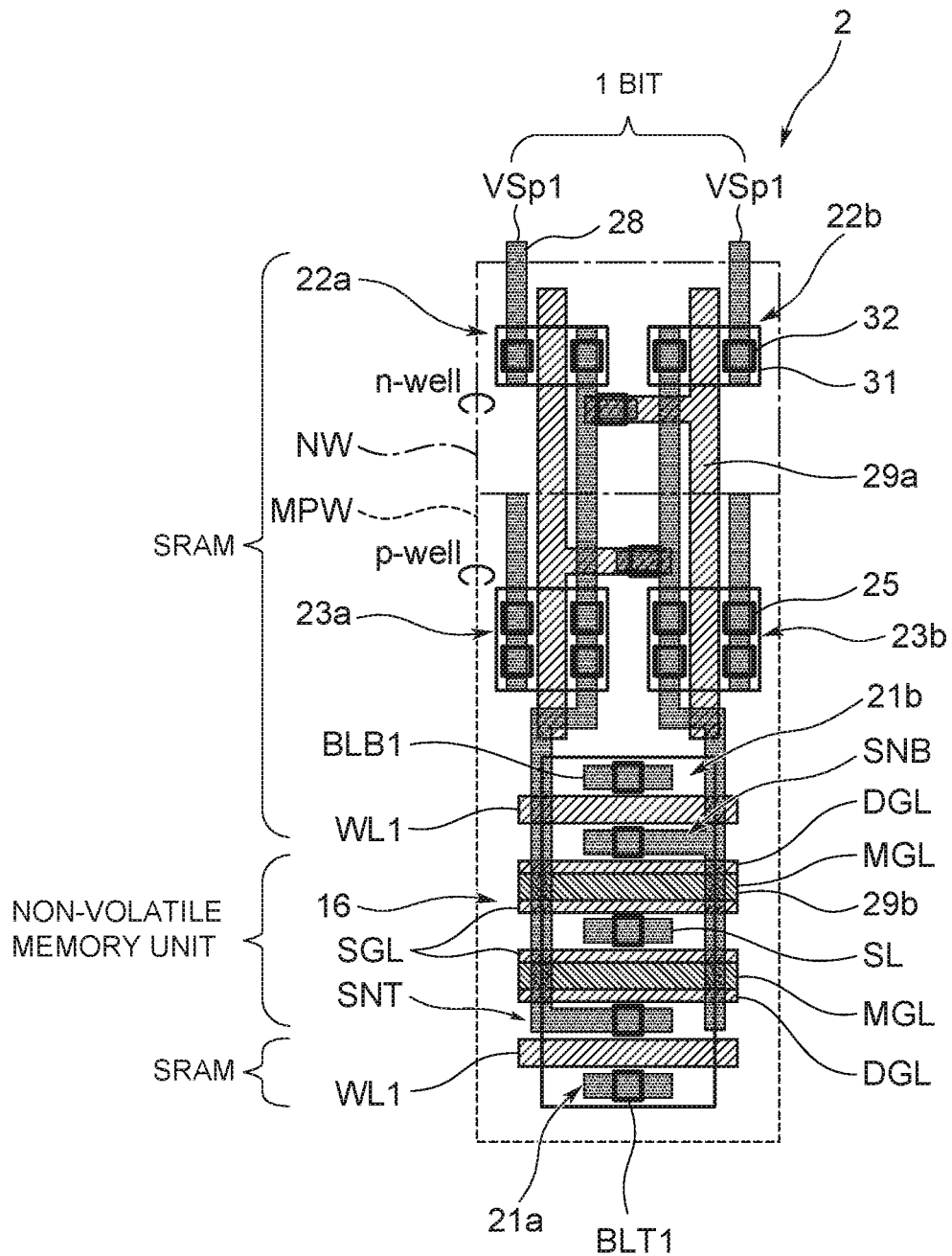
FIG. 3 is a schematic view illustrating an arrangement pattern of the circuit configuration of the non-volatile SRAM memory cell illustrated in FIG. 2.

FIG. 3 is a schematic view illustrating an exemplary arrangement pattern for achieving a circuit configuration of the non-volatile SRAM memory cell 2 illustrated in FIG. 2. In such a non-volatile SRAM memory cell 2, for example, the first load transistor 22a and the second load transistor 22b of the SRAM 15 are disposed in an N-type well NW ("n-well" in FIG. 3). In this non-volatile SRAM memory cell 2, for example, the transistors (the first drain side select transistor 18a, the second drain side select transistor 18b, the first memory transistor 19a, the second memory transistor 19b, the first source side select transistor 20a, and the second source side select transistor 20b (not illustrated)) included in the non-volatile memory unit 16 are disposed in a P-type memory well MPW ("p-well" in FIG. 3) of a conduction type different from that of the well NW.

The memory well MPW includes, in addition to the non-volatile memory unit 16, the first drive transistor 23a, the second drive transistor 23b, the first access transistor 21a, and the second access transistor 21b of the SRAM 15. Accordingly, the first drive transistor 23a, the second drive transistor 23b, the first access transistor 21a, and the second access transistor 21b of a conduction type same as that of the non-volatile memory unit 16 among the transistors included in the SRAM 15 are disposed in the memory well MPW in which the non-volatile memory unit 16 is disposed in the non-volatile SRAM memory cell 2. Thus, in the non-volatile SRAM memory cell 2, the memory well MPW used to form the non-volatile memory unit 16 can be used to form the SRAM 15, which eliminates the need to form a redundant semiconductor region dedicated to the SRAM 15, thereby achieving downsizing as a whole.

The first load transistor 22a and the second load transistor 22b of the SRAM 15 are arranged side by side in one direction in the well NW and disposed adjacent to the memory well MPW. The memory well MPW includes, in a region adjacent to the well NW, the first drive transistor 23a and the second drive transistor 23b of the SRAM 15 arranged side by side in one direction. The memory well MPW also includes the first access transistor 21a and the second access transistor 21b of the SRAM 15 and the non-volatile memory unit 16. Specifically, the second access transistor 21b on the other side of the SRAM 15, the non-volatile memory unit 16, and the first access transistor 21a on the one side of the SRAM 15 are formed in this order in a direction departing from the well NW (in this case, a direction orthogonal to the direction in which the first drive transistor 23a and the second drive transistor 23b are arranged side by side).

In FIG. 3, a dotted region represents a metal layer 28, a hatched region 29a represents a first polysilicon layer, an oppositely hatched region 29b represents a second polysilicon layer, a frame 31 represents an active region in which a MOS transistor and a diffusion layer are disposed, and a rectangular region 32 represents a contact. In the present embodiment, the metal layers 28 as the power supply lines VSp1 are connected with the first load transistor 22a and the second load transistor 22b in the well NW. Another metal layer 28 connected with the first load transistor 22a extends toward the memory well MPW, and is connected with the first drive transistor 23a, the non-volatile memory unit 16, and the first access transistor 21a, which are disposed in the memory well MPW, in this order. Part of this metal layer 28 serves as the first storage node SNT. Similarly, another metal layer 28 connected with the second load transistor 22b extends toward the memory well MPW, and is connected with the second drive transistor 23b, the second access transistor 21b, and the non-volatile memory unit 16, which are disposed in the memory well MPW, in this order. Part of this metal layer 28 serves as the second storage node SNB.

In the memory well MPW, the complementary second bit line BLB1, the word line WL1, the drain side select gate line DGL, the memory gate line MGL, the source side select gate line SGL, the memory gate line MGL, the drain side select gate line DGL, the word line WL1, and the complementary first bit line BLT1 are arranged in this order corresponding to the arrangement order of the second access transistor 21b, the non-volatile memory unit 16, and the first access transistor 21a in the direction departing from the well NW. In the memory well MPW, the two source side select gate lines SGL are disposed between the memory gate lines MGL, and the source line SL is disposed between these two source side select gate lines SGL. In the non-volatile SRAM memory cell 2 with this arrangement configuration, the SRAM 15 and the non-volatile memory unit 16 are efficiently arranged in a minimum possible area.

Figures 4, 5:
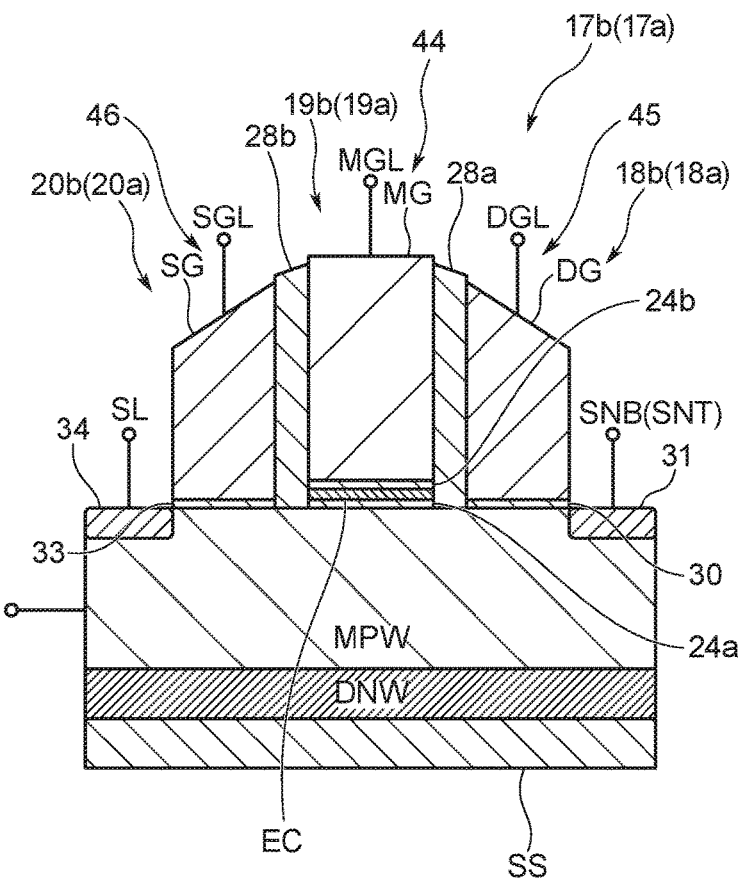
FIG. 4 is a cross-sectional view illustrating a cross section of a first memory cell or a second memory cell.
FIG. 5 is a table listing a voltage value of each site in a programming operation to program SRAM data in an SRAM to a non-volatile memory unit, a memory data erasing operation at the non-volatile memory unit, a programming operation to externally write external data to the SRAM, and a reading operation to externally read the SRAM data in the SRAM.

The following describes cross sections of the first memory cell 17a and the second memory cell 17b included in the non-volatile memory unit 16. Since the first memory cell 17a and the second memory cell 17b have identical configurations, the description will be made mainly on the second memory cell 17b. In the present embodiment, as illustrated in FIG. 4, the second memory cell 17b includes the P-type memory well MPW disposed through an N-type deep well DNW over a semiconductor substrate SS. The second memory transistor 19b included in an N-type transistor structure, the second drain side select transistor 18b included in an N-type MOS transistor structure, and the second source side select transistor 20b included in an N-type MOS transistor structure are disposed in the memory well MPW.

A drain region 31 and a source region 34 are disposed on a surface of the memory well MPW at a distance therebetween. The drain region 31 is disposed at one end of the second drain side select transistor 18b, and the source region 34 is disposed at one end of the second source side select transistor 20b. The drain region 31 is connected with the second storage node SNB of the SRAM 15, and the source region 34 is connected with the source line SL. In the present embodiment, the drain region 31 and the source region 34 have impurity concentrations larger than or equal to $1.0E20/cm^3$, and the memory well MPW has, in a surface region (for example, a region to a depth of 50 nm from the surface) in which a channel layer is formed, an impurity concentration smaller than or equal to $1.0E19/cm^3$, preferably smaller than or equal to $3.0E18/cm^3$.

The second memory transistor 19b includes a charge storage layer EC made of silicon nitride ($Si_3N_4$), silicon oxynitride (SiON), or alumina ($Al_2O_3$) over the memory well MPW between the drain region 31 and the source region 34 through a lower gate insulating film 24a made of an insulating material such as $SiO_2$. The second memory transistor 19b also includes a memory gate electrode MG over the charge storage layer EC through an upper gate insulating film 24b made of an insulating material such as $SiO_2$. In the second memory transistor 19b with this configuration, the lower gate insulating film 24a and the upper gate insulating film 24b insulate the charge storage layer EC from the memory well MPW and the memory gate electrode MG.

The second memory transistor 19b includes a memory gate structure 44 including the lower gate insulating film 24a, the charge storage layer EC, the upper gate insulating film 24b, and the memory gate electrode MG. The memory gate structure 44 is provided with, along a first sidewall thereof, a sidewall spacer 28a made of an insulating material, is disposed adjacent to a drain side select gate structure 45 of the second drain side select transistor 18b through the sidewall spacer 28a. The sidewall spacer 28a, which is disposed between the memory gate structure 44 and the drain side select gate structure 45, has a thickness enough to insulate the memory gate structure 44 and the drain side select gate structure 45.

In a case in which the distance between the memory gate structure 44 and the drain side select gate structure 45 is less than 5 nm, a breakdown voltage potentially occurs to the sidewall spacer 28a when a certain voltage is applied to the memory gate electrode MG and a drain side select gate electrode DG of the drain side select gate structure 45. In a case in which the distance between the memory gate structure 44 and the drain side select gate structure 45 exceeds 40 nm, the resistance of the memory well MPW increases between the memory gate electrode MG and the drain side select gate electrode DG, and thus readout current is unlikely to occur between the memory gate structure 44 and the drain side select gate structure 45 at data reading to be described later. For this reason, in the present embodiment, the sidewall spacer 28a between the memory gate structure 44 and the drain side select gate structure 45 desirably has a width between 5 nm and 40 nm inclusive.

The drain side select gate structure 45 includes, over the memory well MPW between the sidewall spacer 28a and the drain region 31, a select gate insulating film 30 having a thickness less than or equal to 9 nm, preferably less than or equal to 4 nm, and made of an insulating material. The drain side select gate electrode DG connected with the drain side select gate line DGL is disposed on the select gate insulating film 30.

The memory gate structure 44 is provided with, along a second sidewall thereof, a sidewall spacer 28b made of an insulating material, and is disposed adjacent to a source side select gate structure 46 of the second source side select transistor 20b through the sidewall spacer 28b. The sidewall spacer 28b, which is disposed between the memory gate structure 44 and the source side select gate structure 46, has a thickness equal to that of first the sidewall spacer 28a to insulate the memory gate structure 44 and the source side select gate structure 46.

In a case in which the distance between the memory gate structure 44 and the source side select gate structure 46 is less than 5 nm, a breakdown voltage potentially occurs to the sidewall spacer 28b when a certain voltage is applied to the memory gate electrode MG and a source side select gate electrode SG of the source side select gate structure 46. In a case in which the distance between the memory gate structure 44 and the source side select gate structure 46 exceeds 40 nm, the resistance of the memory well MPW increases between the memory gate electrode MG and the source side select gate electrode SG, and thus readout current is unlikely to occur between the memory gate structure 44 and the source side select gate structure 46 at data reading to be described later. For this reason, in the present embodiment, the sidewall spacer 28a between the memory gate structure 44 and the source side select gate structure 46 desirably has a width between 5 nm and 40 nm inclusive.

The source side select gate structure 46 includes, over the memory well MPW between the sidewall spacer 28b and the source region 34, a select gate insulating film 33 having a thickness less than or equal to 9 nm, preferably less than or equal to 4 nm, and made of an insulating material. The source side select gate electrode SG connected with the source side select gate line SGL is formed on the select gate insulating film 33.

In the present embodiment, the drain side select gate electrode DG and the source side select gate electrode SG, which are disposed along sidewalls of the memory gate electrode MG through the sidewall spacers 28a and 28b, each have a sidewall shape in which the height of the select gate electrode decreases with the distance from the memory gate electrode MG such that the top portion of the select gate electrode slopes down toward the memory well MPW.

FIG. 5 lists an exemplary voltage value at each site in a programming operation to program the SRAM data in the SRAM 15 to the non-volatile memory unit 16 ("Program (sram to flash)" in FIG. 5), a data erasing operation to erase data in the non-volatile memory unit 16 ("Erase (reset data in flash)" in FIG. 5), an external data writing operation to externally write external data to the SRAM 15 ("Write (external data to sram)" in FIG. 5), and a reading operation to read the SRAM data from the SRAM 15 ("Read (output sram data)" in FIG. 5) in the non-volatile SRAM memory cell 2. In FIG. 5, "Don't care" indicates that an optional voltage value can be set to the site. The following description will be made on the external data writing operation, the reading operation, the programming operation, and the data erasing operation, followed by description of a memory data programming operation to program memory data stored in the non-volatile memory unit 16 to the SRAM 15.

(3) External Data Writing Operation to Write External Data to SRAM

The following first describes the external data writing operation at the SRAM 15 illustrated in FIG. 2. In the external data writing to the SRAM 15, the power supply voltage VDD (for example, smaller than or equal to 1.5 V) is applied to the word line WL1 to turn on the first access transistor 21a and the second access transistor 21b connected with the word line WL1. Simultaneously, the power supply voltage VDD is applied to the power supply line VSp1, and the reference voltage line VSn1 is grounded. In the SRAM 15 illustrated in FIG. 2, for example, when the power supply voltage VDD is applied to the complementary first bit line BLT1 on the one side, the voltage of 0 V is applied to the complementary second bit line BLB1 on the other side.

Accordingly, the voltage of 0 V at the complementary second bit line BLB1 is applied to a gate of each of the first load transistor 22a and the first drive transistor 23a on the one side through electrical connection between the complementary second bit line BLB1 and the gate through the second access transistor 21b on the other side. As a result, the first load transistor 22a is turned on, and the first drive transistor 23a is turned off. Accordingly, the first storage node SNT between the first load transistor 22a and the first drive transistor 23a is electrically connected with the power supply line VSp1 through the first load transistor 22a and has a High ("1") level voltage due to the power supply voltage VDD through the power supply line VSp1.

Simultaneously, a voltage of VDD−Vt (Vt is a threshold voltage of the first access transistor 21a) is applied to a gate of each of the second load transistor 22b and the second drive transistor 23b on the other side through electrical connection between the complementary first bit line BLT1 and the gate through the first access transistor 21a on the one side. Then, since the potential of the first storage node SNT is at the power supply voltage VDD as described above, the first access transistor 21a is turned off. As a result, the second load transistor 22b is turned off, and the second drive transistor 23b is turned on. Accordingly, the second storage node SNB between the second load transistor 22b and the second drive transistor 23b is electrically connected with the reference voltage line VSn1 through the second drive transistor 23b and has a Low ("0") level voltage due to the reference voltage line VSn1.

In this manner, external data is written to the first storage node SNT and the second storage node SNB of the SRAM 15 and stored as the SRAM data in the first storage node SNT and the second storage node SNB. In this state, the first drain side select transistor 18a and the second drain side select transistor 18b of the non-volatile memory unit 16 are turned off to block electric connection with the first storage node SNT and the second storage node SNB of the SRAM 15 and allow only the SRAM 15 to operate.

When external data is not to be written to the SRAM 15, the voltage of 0 V is applied to the word line WL1 to turn off the first access transistor 21a and the second access transistor 21b. Accordingly, electric connection between the SRAM 15 and each of the complementary first bit line BLT1 and the complementary second bit line BLB1 is blocked to prevent external data writing to the SRAM 15.

(4) Reading Operation to Read SRAM Data from SRAM

The following describes the reading operation to read the SRAM data stored in the SRAM 15. To read the SRAM data in the SRAM 15, the power supply voltage VDD is applied to the word line WL1 to turn on the first access transistor 21a and the second access transistor 21b connected with the word line WL1. Then, the voltage of the first storage node SNT on the one side of the non-volatile SRAM memory cell 2 is read through the complementary first bit line BLT1, and the voltage of the second storage node SNB on the other side is read through the complementary second bit line BLB1. Accordingly, the SRAM data stored at the first storage node SNT and the second storage node SNB is determined to be the Low ("0") or High ("1") level voltage by the sense amplifier and data input circuit 9b (FIG. 1) connected with the complementary first bit line BLT1 and the complementary second bit line BLB1.

When the SRAM data stored in the SRAM 15 is not to be read, the voltage of 0 V is applied to the word line WL1 to turn off the first access transistor 21a and the second access transistor 21b. Accordingly, electric connection between the complementary first bit line BLT1 and the complementary second bit line BLB1 of the SRAM 15 is blocked to prevent reading of the SRAM data.

(5) Programming Operation to Program SRAM Data in SRAM to Non-Volatile Memory Unit In the present invention, the SRAM data stored in the SRAM 15 described above can be programmed into the non-volatile memory unit 16 based on the principle of the quantum tunneling effect. In the present embodiment, the common memory gate line MGL is shared by the non-volatile SRAM memory cells 2 of the non-volatile semiconductor memory device 1. Thus, the same charge storage gate voltage is applied to all non-volatile SRAM memory cells 2 at once through the memory gate line MGL. Accordingly, the SRAM data in the SRAMs 15 of all non-volatile SRAM memory cells 2 are programmed into the respective non-volatile memory units 16 all at once.

In each non-volatile SRAM memory cell 2 according to the present invention, the SRAM data is stored as memory data in a non-volatile manner as follows. Depending on whether the first storage node SNT and the second storage node SNB of the SRAM 15 are each at the Low ("0") level voltage or the High ("1") level voltage, charge is injected into the charge storage layer EC of one of the first memory cell 17a and the second memory cell 17b of the non-volatile memory unit 16, and charge is prevented from being injected into the charge storage layer EC of the other memory cell.

Two methods are employed to prevent the charge injection into the charge storage layer EC in the first memory cell 17a or the second memory cell 17b of the non-volatile memory unit 16 of the non-volatile SRAM memory cell 2 according to the present invention. These methods will be described in "(5-1) Prevention of charge injection into charge storage layer when no channel layer is formed" and "(5-2) Prevention of charge injection into charge storage layer when channel layer is formed". The description will be sequentially made on "(5-1) Prevention of charge injection into charge storage layer when no channel layer is formed" and "(5-2) Prevention of charge injection into charge storage layer when channel layer is formed".

When the programming operation is executed by the methods described in "(5-1) Prevention of charge injection into charge storage layer when no channel layer is formed" and "(5-2) Prevention of charge injection into charge storage layer when channel layer is formed", the memory data already programmed into the non-volatile memory unit 16 is desirably erased in accordance with "(6) Memory data erasing operation at non-volatile memory unit" to be described later.

(5-1) Prevention of Charge Injection into Charge Storage Layer when No Channel Layer is Formed (5-1-1) Carrier Removal Operation Performed Before Programming Operation The non-volatile SRAM memory cell 2 executes a carrier removal operation before the programming operation to program the SRAM data stored in the SRAM 15 to the non-volatile memory unit 16 based on the principle of the quantum tunneling effect. In the carrier removal operation, the non-volatile SRAM memory cell 2 according to the present invention removes carriers that would form a channel layer in a region of the memory well MPW facing the memory gate electrode MG of each of the first memory cell 17a and the second memory cell 17b, in advance from a region (hereinafter referred to as a channel layer formation carrier region) including the carriers.

Accordingly, in one of the first memory cell 17a and the second memory cell 17b, in which charge injection into the charge storage layer EC is prevented, a depletion layer (to be described later) is formed in the programming operation to be described later without forming a channel layer in the region of the memory well MPW facing the memory gate electrode MG.

As illustrated in FIGS. 2 and 5, in the non-volatile SRAM memory cell 2, the voltage of 0 V is applied to the drain side select gate line DGL, and the off voltage of 0 V is applied to the drain side select gate electrodes DG of the first drain side select transistor 18a of the first memory cell 17a and the second drain side select transistor 18b of the second memory cell 17b through the drain side select gate line DGL. Accordingly, in the non-volatile memory unit 16, the first drain side select transistor 18a of the first memory cell 17a is turned off, and the second drain side select transistor 18b of the second memory cell 17b is turned off. As a result, the first drain side select transistor 18a blocks an electrical connection between the first storage node SNT of the SRAM 15 and the first memory cell 17a, and the second drain side select transistor 18b blocks an electrical connection between the second storage node SNB of the SRAM 15 and the second memory cell 17b.

Simultaneously, in the non-volatile SRAM memory cell 2, an on voltage at the power supply voltage VDD is applied to the source side select gate line SGL, and the voltage of 0 V is applied to the source line SL. Accordingly, in the first source side select transistor 20a and the second source side select transistor 20b are turned on due to a voltage difference between the source side select gate electrode SG connected with the source side select gate line SGL and one end connected with the source line SL.

As a result, in each of the first memory cell 17a and the second memory cell 17b, the surface of the memory well MPW facing the source side select gate electrode SG of the first source side select transistor 20a or the second source side select transistor 20b becomes a conductive state. Accordingly, the source region 34 connected with the source line SL is electrically connected with the channel layer formation carrier region of the memory well MPW facing the memory gate structure 44.

Simultaneously, a substrate voltage of 0 V, which is same as that to the source line SL, is applied to the memory well MPW of each of the first memory cell 17a and the second memory cell 17b, and a carrier removal voltage of −2 V is applied to the memory gate electrode MG of the first memory transistor 19a or the second memory transistor 19b through the memory gate line MGL. The carrier removal voltage applied to the memory gate electrode MG is determined with respect to a threshold voltage (Vth) at which a channel layer is formed in the memory well MPW facing the memory gate electrode MG in each of the first memory transistor 19a and the second memory transistor 19b. The carrier removal voltage is a voltage value lower than the threshold voltage.

Accordingly, in each of the first memory cell 17a and the second memory cell 17b, carriers (electrons in this case) induced in the channel layer formation carrier region are moved from the channel layer formation carrier region to the source region 34 by the carrier removal voltage applied to the memory gate electrode MG to remove the carriers from the channel layer formation carrier region.

In the present embodiment, since the memory gate structure 44 of each of the first memory cell 17a and the second memory cell 17b is disposed on the P-type memory well MPW to form an N-type MOS transistor structure, the carrier removal voltage for excluding carriers from the channel layer formation carrier region is, for example, −2.0 V. With this configuration, if the threshold voltage is set to be −1.5 V for the first memory transistor 19a and the second memory transistor 19b of the first memory cell 17a and the second memory cell 17b, carriers in the channel layer formation carrier region can be moved to the source region 34 conductively connected with the channel layer formation carrier region by the carrier removal voltage applied through the memory gate electrode MG, and can be excluded from the channel layer formation carrier region to allow no channel layer to be formed.

A threshold voltage for the memory gate structure 44 differs between a case in which charge is stored in the charge storage layer EC and a case in which no charge is stored in the charge storage layer EC. The carrier removal voltage is desirably determined with respect to the threshold voltage after the erasing operation because an erasing operation to erase memory data in the non-volatile memory unit 16 of the non-volatile SRAM memory cell 2 in advance is executed before the carrier removal operation. The carrier removal voltage is desirably lower than the threshold voltage.

With this configuration, in each of the first memory cell 17a and the second memory cell 17b, the carrier removal voltage lower than the threshold voltages of the first memory transistor 19a and the second memory transistor 19b is applied to the memory gate electrode MG of the first memory transistor 19a or the second memory transistor 19b. Accordingly, even when the first memory transistor 19a or the second memory transistor 19b is in a depleted state, carriers induced in the channel layer formation carrier region of the memory well MPW directly below the memory gate structure 44 are removed from the channel layer formation carrier region to achieve a state without a channel layer but with a depletion layer including no carriers.

(5-1-2) Programming Operation after Carrier Removal Operation

Through the carrier removal operation described above, carriers are removed from the channel layer formation carrier region of the memory well MPW directly below the memory gate structure 44 of each of the first memory cell 17a and the second memory cell 17b of the non-volatile SRAM memory cell 2. Then, depending on whether the first storage node SNT and the second storage node SNB of the SRAM 15 are each at the Low ("0") level voltage or the High ("1") level voltage, charge is injected into the charge storage layer EC of one of the first memory cell 17a and the second memory cell 17b of the non-volatile memory unit 16, but charge is prevented from being injected into the charge storage layer EC of the other memory cell. In this manner, the SRAM data in the SRAM 15 is programmed into the non-volatile memory unit 16.

The following description will be made on an example in which, in the SRAM 15, the first storage node SNT on the one side is at the "High" level (the power supply voltage VDD) voltage, and the second storage node SNB on the other side is at the "Low" level (0 V) voltage.

In this case, the voltage of 0 V is applied to the word line WL1 in the non-volatile SRAM memory cell 2 as listed in the column "Program (sram to flash)" in FIG. 5. Accordingly, the first access transistor 21a and the second access transistor 21b of the SRAM 15 are turned off to block an electrical connection between the complementary first bit line BLT1 and the SRAM 15 and an electrical connection between the complementary second bit line BLB1 and the SRAM 15.

Simultaneously, in the non-volatile SRAM memory cell 2, for example, the charge storage gate voltage of 12 V is applied to the memory gate line MGL, the voltage of the power supply voltage VDD is applied to the drain side select gate line DGL, and the voltage of 0 V is applied to the source side select gate line SGL and the source line SL. Accordingly, the voltage of 0 V is applied to the gate of each of the first source side select transistor 20a and the second source side select transistor 20b of the non-volatile memory unit 16 through the source side select gate line SGL, and the voltage of 0 V is applied to one end thereof through the source line SL, and thus the first source side select transistor 20a and the second source side select transistor 20b are turned off due to a voltage difference between the gate and the one end. As a result, in the non-volatile memory unit 16, the first source side select transistor 20a blocks an electrical connection between the first memory transistor 19a and the source line SL, and the second source side select transistor 20b blocks an electrical connection between the second memory transistor 19b and the source line SL.

Simultaneously, in the non-volatile memory unit 16, one end of the second drain side select transistor 18b of the second memory cell 17b on the other side is electrically connected the second storage node SNB on the other side at the "Low" level (0 V) voltage (in this case, in a state in which no data is programmed). Thus, the one end of the second drain side select transistor 18b is at the "Low" level voltage same as that of the second storage node SNB.

Accordingly, the second drain side select transistor 18b is turned on due to the voltage difference between the gate and the one end. As a result, in the second memory transistor 19b, the memory well MPW facing the memory gate electrode MG is at the "Low" level voltage same as that of the second storage node SNB through the second drain side select transistor 18b. Thus, the memory well MPW and the memory gate electrode MG, to which the charge storage gate voltage of 12 V is applied, have a large voltage difference therebetween enough to cause the quantum tunneling effect to inject charge into the charge storage layer EC.

Simultaneously, in the non-volatile memory unit 16, one end of the first drain side select transistor 18a of the first memory cell 17a on the one side is connected with the first storage node SNT on the one side at the "High" level voltage (power supply voltage VDD) (in this case, in a state in which data is programmed). Thus, the one end of the first drain side select transistor 18a is at the "High" level voltage (power supply voltage VDD) same as that of the first storage node SNT. Accordingly, since the power supply voltage VDD is applied to the gate of the first drain side select transistor 18a through the drain side select gate line DGL, the other end of the first drain side select transistor 18a, which is connected with the first memory transistor 19a, is charged to a voltage of VDD−Vta (Vta is a threshold voltage of the first drain side select transistor 18a). However, the first drain side select transistor 18a is turned off beyond the voltage in any charge operation because the first source side select transistor 20a is turned off. Thus, the first drain side select transistor 18a is effectively turned off in this case.

Figure 6A:
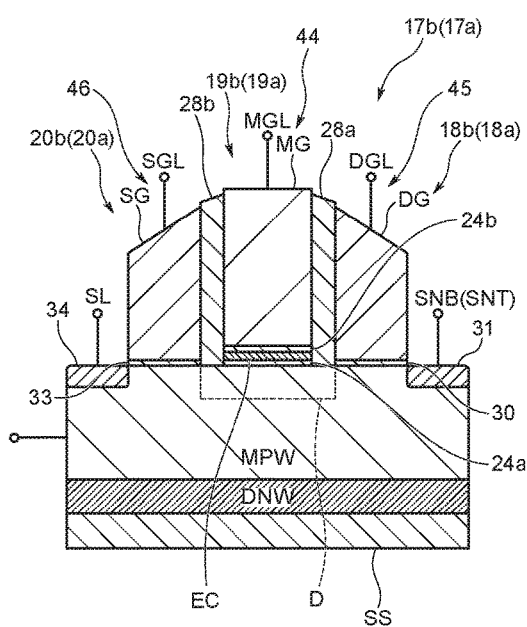
FIG. 6A is a cross-sectional view for description of prevention of charge injection into a charge storage layer when no channel layer is formed.

In this state, carriers are removed through the carrier removal operation in advance from the channel layer formation carrier region of the memory well MPW of the first memory transistor 19a of the first memory cell 17a. When the first drain side select transistor 18a and the first source side select transistor 20a are turned off in this state, no channel layer is formed but a depletion layer D in which no charge exists is formed in the memory well MPW directly below the memory gate structure 44 as illustrated in FIG. 6A.

A voltage difference Vono between the memory gate electrode MG and the surface of the memory well MPW in the first memory cell 17a can be obtained through the following formula. In the formula, q represents the elementary charge, Na represents the acceptor concentration of the memory well MPW, and Cono represents the capacitance (hereinafter also referred to as a memory gate capacitance) of the three layers of the upper gate insulating film 24b, the charge storage layer EC, and the lower gate insulating film 24a. In addition, $\varepsilon_1$ represents the relative permittivity of a material (silicon in the present embodiment) forming the memory well MPW, $\varepsilon_0$ represents the permittivity of vacuum, and Vfb represents a flat band voltage.

$$Vono = \frac{q*Na}{Cono} * \left\{ \sqrt{\left(\frac{\varepsilon_1 * \varepsilon_0}{Cono}\right)^2 + \frac{2\varepsilon_1 * \varepsilon_0}{q*Na} *(Vg - Vfb)} - \frac{\varepsilon_1 * \varepsilon_0}{Cono} \right\}$$ [Formula 1]

In the present embodiment, the voltage difference Vono between the memory gate electrode MG and the surface of the memory well MPW is 3.5 V approximately when Vfb is 0 V, Vg is 12 V, Na is $2.0E17 \text{ cm}^{-3}$, the thickness of the upper gate insulating film 24b is 2 nm, the thickness of the charge storage layer EC is 12 nm, and the thickness of the lower gate insulating film 24a is 2 nm.

With this configuration, in the memory gate structure 44 of the first memory cell 17a, the voltage difference Vono between the memory gate electrode MG and the surface of the memory well MPW is 2 V approximately when the charge storage gate voltage of 12 V is applied to the memory gate electrode MG. Accordingly, the memory gate electrode MG and the surface of the memory well MPW have no voltage difference therebetween large enough to cause the quantum tunneling effect, thereby preventing charge injection into the charge storage layer EC.

In addition, since no impurity diffusion region having a high impurity concentration is formed in a region of the memory well MPW between the memory gate structure 44 and the drain side select gate structure 45 of the first memory cell 17a, the depletion layer D can be reliably formed in the memory well MPW between the memory gate structure 44 and the drain side select gate structure 45. This depletion layer D prevents application of the potential of the surface of the memory well MPW directly below the memory gate structure 44 to the select gate insulating film 30.

Thus, the select gate insulating film 30 of the drain side select gate structure 45 can have a small thickness in accordance with a low voltage value applied to the drain region 31 from the SRAM 15 because the depletion layer D blocks the potential of the surface of the memory well MPW directly below the memory gate structure 44, thereby preventing insulation breakdown of the select gate insulating film 30 due to the potential of the surface of the memory well MPW.

In addition, since no impurity diffusion region having a high impurity concentration is formed in a region of the memory well MPW between the memory gate structure 44 and the source side select gate structure 46, the depletion layer D can be reliably formed in the memory well MPW between the memory gate structure 44 and the source side select gate structure 46. This depletion layer D prevents application of the potential of the surface of the memory well MPW directly below the memory gate structure 44 to the select gate insulating film 33.

Thus, the select gate insulating film 33 of the source side select gate structure 46 can have a small thickness in accordance with a low source voltage applied to the source region 34 through the source line SL because the depletion layer D blocks the potential of the surface of the memory well MPW directly below the memory gate structure 44, thereby preventing insulation breakdown of the select gate insulating film 33 due to the potential of the surface of the memory well MPW.

In this manner, in the non-volatile SRAM memory cell 2, depending on whether the first storage node SNT and the second storage node SNB of the SRAM 15 are at the Low ("0") level voltage or the High ("1") level voltage, charge is injected into the charge storage layer EC of one of the first memory cell 17a and the second memory cell 17b of the non-volatile memory unit 16, and charge is prevented from being injected into the charge storage layer EC of the other memory cell. Accordingly, the SRAM data stored in the SRAM 15 can be programmed into the non-volatile memory unit 16 and stored therein as memory data in a non-volatile manner.

(5-2) Prevention of Charge Injection into Charge Storage Layer when Channel Layer is Formed The following describes the programming operation according to another embodiment different from the embodiment described above in "(5-1) Prevention of charge injection into charge storage layer when no channel layer is formed". In the present embodiment, at start of the programming operation in the first memory cell 17a and the second memory cell 17b of each of the non-volatile SRAM memory cell 2, the potential in the memory well MPW directly below the memory gate structure 44 potentially changes depending on the state of storage of charge in the charge storage layer EC of the first memory transistor 19a or the second memory transistor 19b. Thus, a channel potential adjustment operation is desirably executed before the programming operation. In the channel potential adjustment operation, for example, a source voltage of 0 V is applied to the source line SL, the power supply voltage VDD is applied to the source side select gate line SGL and the memory gate line MGL, and channel potentials of the first memory transistor 19a and the second memory transistor 19b are adjusted to the potential of the source line SL.

In the non-volatile SRAM memory cell 2, after the channel potentials of the first memory transistor 19a and the second memory transistor 19b are adjusted to the potential of the source line SL, the source side select gate electrode SG of each of the first source side select transistor 20a and the second source side select transistor 20b is set back to a gate off voltage of 0 V, and then the programming operation is started. After the channel potentials of the first memory transistor 19a and the second memory transistor 19b are adjusted to the potential of the source line SL in this manner, carriers exist in the channel layer formation carrier region of the memory well MPW of the first memory transistor 19a and the second memory transistor 19b.

The following describes the programming operation to program the SRAM data in the SRAM 15 to the non-volatile memory unit 16 when, for example, in the SRAM 15, the first storage node SNT on the one side is at the "High" level voltage (power supply voltage VDD), and the second storage node SNB on the other side is at the "Low" level (0 V) voltage.

In this case, the voltage of 0 V is applied to the word line WL1 in the non-volatile SRAM memory cell 2 as listed in the column "Program (sram to flash)" in FIG. 5. Accordingly, the first access transistor 21a and the second access transistor 21b of the SRAM 15 are turned off to block the electrical connection between the complementary first bit line BLT1 and the SRAM 15 and the electrical connection between the complementary second bit line BLB1 and the SRAM 15.

Simultaneously, in the non-volatile SRAM memory cell 2, for example, the charge storage gate voltage of 12 V is applied to the memory gate line MGL, the voltage of the power supply voltage VDD is applied to the drain side select gate line DGL, and the voltage of 0 V is applied to the source side select gate line SGL and the source line SL. Accordingly, the voltage of 0 V is applied to the gate of each of the first source side select transistor 20a and the second source side select transistor 20b of the non-volatile memory unit 16 through the source side select gate line SGL, and the voltage of 0 V is applied to one end thereof through the source line SL, and thus the first source side select transistor 20a and the second source side select transistor 20b are turned off due to the voltage difference between the gate and the one end. As a result, in the non-volatile memory unit 16, the first source side select transistor 20a blocks the electrical connection between the first memory transistor 19a and the source line SL, and the second source side select transistor 20b blocks the electrical connection between the second memory transistor 19b and the source line SL.

Simultaneously, in the non-volatile memory unit 16, the one end of the second drain side select transistor 18b of the second memory cell 17b on the other side is electrically connected with the second storage node SNB on the other side at the "Low" level (0 V) voltage (in this case, in a state in which no data is programmed). Thus, the one end of the second drain side select transistor 18b is at the "Low" level voltage same as that of the second storage node SNB.

Accordingly, the second drain side select transistor 18b is turned on due to the voltage difference between the gate and the one end. As a result, in the second memory transistor 19b, the memory well MPW facing the memory gate electrode MG is at the "Low" level voltage same as that of the second storage node SNB through the second drain side select transistor 18b. Thus, the memory well MPW and the memory gate electrode MG, to which the charge storage gate voltage of 12 V is applied, have a large voltage difference therebetween enough to cause the quantum tunneling effect to inject charge into the charge storage layer EC.

Simultaneously, in the non-volatile memory unit 16, the one end of the first drain side select transistor 18a of the first memory cell 17a on the one side is connected with the first storage node SNT on the one side at the "High" level voltage (power supply voltage VDD) (in this case, in a state in which data is programmed). Thus, the one end of the first drain side select transistor 18a is at the "High" level voltage (power supply voltage VDD) same as that of the first storage node SNT. Accordingly, since the power supply voltage VDD of 12 V is applied to the gate of the first drain side select transistor 18a through the drain side select gate line DGL, the other end thereof connected with the first memory transistor 19a is charged to a voltage of VDD−Vta (Vta is a threshold voltage of the first drain side select transistor 18a). The first drain side select transistor 18a is turned off beyond the voltage in any charge operation because the first source side select transistor 20a is turned off. Thus, the first drain side select transistor 18a is effectively turned off in this case.

Figure 6B:
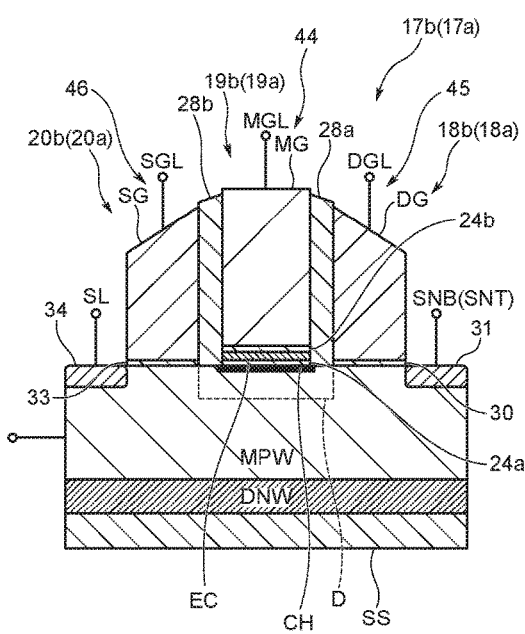
FIG. 6B is a cross-sectional view for description of prevention of charge injection into the charge storage layer when a channel layer is formed.

In this state, carriers exist through the channel potential adjustment operation from the channel layer formation carrier region of the memory well MPW of the first memory transistor 19a of the first memory cell 17a. When the first drain side select transistor 18a and the first source side select transistor 20a on both sides of the first memory transistor 19a are turned off in this state, an electrical connection between a channel layer CH formed at the surface of the memory well MPW and each of the drain region 31 and the source region 34 is blocked due to the charge storage gate voltage applied to the memory gate electrode MG as illustrated in FIG. 6B, and thus the depletion layer D is formed around the channel layer CH.

A capacitor C2 (hereinafter referred to as a gate-insulator capacitor) is achieved by the three-layer configuration of the upper gate insulating film 24b, the charge storage layer EC, and the lower gate insulating film 24a. A capacitor C1 (hereinafter referred to as a depletion-layer capacitor) is achieved by the depletion layer D formed in the memory well MPW and surrounding the channel layer CH. The gate-insulator capacitor C2 and the depletion-layer capacitor C1 are connected in series. For example, when the gate-insulator capacitor C2 has a capacitance three times as large as that of the depletion-layer capacitor C1, the channel layer CH formed at the surface of the memory well MPW has a channel potential Vch obtained through the following formula.

$$Vch = (\text{MEMORY GATE VOLTAGE } MV - \text{SUBSTRATE VOLTAGE } CV) \times \text{GATE-INSULATOR CAPACITOR } C2/(\text{DEPLETION-LAYER CAPACITOR } C1 + \text{GATE-INSULATOR CAPACITOR } C2) \quad \text{[Formula 2]}$$

Thus, in the present embodiment, the channel potential Vch is 9 V because the memory well MPW has a substrate voltage CV of 0 V, and the memory gate electrode MG has a memory gate voltage MV of 12 V.

Thus, in the memory gate structure 44 of the first memory transistor 19a, the channel potential Vch of the channel layer CH surrounded by the depletion layer D in the memory well MPW is 9 V when the charge storage gate voltage of 12 V is applied to the memory gate electrode MG. Accordingly, the memory gate electrode MG and the channel layer CH has a small voltage difference of 3 V, which is not enough to cause the quantum tunneling effect, thereby preventing charge injection into the charge storage layer EC.

In addition, since no impurity diffusion region having a high impurity concentration is formed in the region of the memory well MPW between the memory gate structure 44 and the drain side select gate structure 45 of the first memory cell 17a. Thus, the depletion layer D can be reliably formed around the channel layer CH formed around the surface of the memory well MPW. This depletion layer D prevents application of the channel potential Vch to the select gate insulating film 30 of the drain side select gate structure 45 from the channel layer CH.

Thus, the select gate insulating film 30 of the drain side select gate structure 45 can have a small thickness in accordance with a low voltage applied to the drain region 31 from the SRAM 15 because the depletion layer D blocks the channel potential Vch of the channel layer CH, thereby preventing insulation breakdown of the select gate insulating film 30 due to the channel potential Vch.

In addition, since no impurity diffusion region having a high impurity concentration is formed in the region of the memory well MPW between the memory gate structure 44 and the source side select gate structure 46, the depletion layer D can be reliably formed around the channel layer CH formed around the surface of the memory well MPW. This depletion layer D prevents application of the channel potential Vch from the channel layer CH to the select gate insulating film 33 of the source side select gate structure 46.

Thus, the select gate insulating film 33 of the source side select gate structure 46 can have a small thickness in accordance with a low source voltage applied to the source region 34 through the source line SL because the depletion layer D blocks the channel potential Vch of the channel layer CH, thereby preventing insulation breakdown of the select gate insulating film 33 due to the channel potential Vch.

In this manner, in the non-volatile SRAM memory cell 2, depending on whether the first storage node SNT and the second storage node SNB of the SRAM 15 are at the Low ("0") level voltage or the High ("1") level voltage, charge is injected into the charge storage layer EC of one of the first memory cell 17a and the second memory cell 17b of the non-volatile memory unit 16, and charge is prevented from being injected into the charge storage layer EC of the other memory cell. Accordingly, the SRAM data stored in the SRAM 15 can be programmed into the non-volatile memory unit 16 and stored as memory data in a non-volatile manner.

(6) Memory Data Erasing Operation at Non-Volatile Memory Unit

The following describes the data the erasing operation to erase memory data stored in the non-volatile memory unit 16. The erasing operation on the memory data in the non-volatile memory unit 16 can be performed by various methods. For example, the erasing operation can be performed by exploiting the quantum tunneling effect to remove charges from the charge storage layer EC of each of the first memory transistor 19a and the second memory transistor 19b.

A voltage value listed in "Erase (reset data in flash)" in FIG. 5 indicates a voltage value at each site when charge is removed from the charge storage layer EC by the quantum tunneling effect. In this case, the voltage of 0 V is applied to the word line WL1 to turn off the first access transistor 21a and the second access transistor 21b of the SRAM 15 of the non-volatile SRAM memory cell 2. Accordingly, the first access transistor 21a blocks an electrical connection between the complementary first bit line BLT1 and the SRAM 15, and the second access transistor 21b blocks an electrical connection between the complementary second bit line BLB1 and the SRAM 15.

In the non-volatile SRAM memory cell 2, the voltage of 0 V is applied to the drain side select gate line DGL to turn off the first drain side select transistor 18a and the second drain side select transistor 18b. Accordingly, the first drain side select transistor 18a blocks the electrical connection between the first storage node SNT of the SRAM 15 and the first memory cell 17a, and the second drain side select transistor 18b blocks the electrical connection between the second storage node SNB of the SRAM 15 and the second memory cell 17b.

Simultaneously, the voltage of 0 V is applied to the source line SL and the source side select gate line SGL of the non-volatile SRAM memory cell 2 to turn off the first source side select transistor 20a and the second source side select transistor 20b. Simultaneously, the memory gate voltage of −12 V is applied to the memory gate electrode MG of each of the first memory transistor 19a and the second memory transistor 19b of the non-volatile SRAM memory cell 2 through the memory gate line MGL. As a result, in the non-volatile memory unit 16, charge in the charge storage layer EC is removed from the charge storage layer EC of each of the first memory transistor 19a and the second memory transistor 19b to the memory well MPW at 0 V, thereby erasing data.

(7) Memory Data Programming Operation to Program Memory Data in Non-Volatile Memory Unit to SRAM The following describes the memory data programming operation to program memory data stored in the non-volatile memory unit 16 to the SRAM 15. For example, initially, the "Low" level voltage is applied to the first storage node SNT of the SRAM 15 and the "High" level voltage is applied to the second storage node SNB. When this SRAM data is programmed into the non-volatile memory unit 16, and then the memory data is again programmed intact from the non-volatile memory unit 16 to the SRAM 15, the "High" level voltage, which is different from the initial voltage, is applied to the first storage node SNT of the SRAM 15, and the "Low" level voltage, which is different from the initial voltage, is applied to the second storage node SNB. Thus, data made of "High" and "Low" level voltages opposite to those of the initial SRAM data is stored in the SRAM 15.

To avoid this problem, in the memory data programming operation at the non-volatile SRAM memory cell 2, after memory data in the non-volatile memory unit 16 is programmed into the SRAM 15, the corresponding SRAM data stored in the SRAM 15 through this memory data programming is read by the bit information inverting circuit 4 (FIG. 1) through the complementary first bit line BLT1 and the complementary second bit line BLB1. Then, the logic of the SRAM data is inverted by the bit information inverting circuit 4, and this inverted data is programmed into the SRAM 15. Accordingly, the SRAM 15 has the "Low" level voltage at the first storage node SNT and the "High" level voltage at the second storage node SNB as initially has.

Specifically, in such a processing, the voltage of 0 V is first applied to the word line WL1 to turn off the first access transistor 21a and the second access transistor 21b of the SRAM 15, thereby blocking the electrical connection between the complementary first bit line BLT1 and the SRAM 15, and the electrical connection between the complementary second bit line BLB1 and the SRAM 15. In addition, the voltage of 0 V is applied to the power supply line Vsp1 in the non-volatile SRAM memory cell 2 to set the potentials of the first storage node SNT and the second storage node SNB to be near 0 V in advance to facilitate a latch operation thereafter.

Then, in the non-volatile SRAM memory cell 2, the power supply voltage VDD is applied to, for example, the drain side select gate line DGL, the source side select gate line SGL, and the memory gate line MGL, and the voltage of 0 V is applied to the source line SL. Accordingly, the second storage node SNB of the SRAM 15 is connected with the source line SL through, for example, the second memory cell 17b in a non-programming state (having a threshold voltage Vth<0 V) to set the "Low" level voltage (0 V: data=0) to the second storage node SNB through the source line SL being at 0 V. Thereafter, the power supply voltage VDD is applied to the power supply line VSp1 to latch the SRAM 15 so that the first storage node SNT is at the "High" level voltage and the second storage node SNB is at the "Low" level voltage.

In this case, before the SRAM data is programmed into the non-volatile memory unit 16, the first storage node SNT of the SRAM 15 is at the "Low" level voltage (0 V: data=0). Then, the data is inverted by programming the corresponding memory data stored in the non-volatile memory unit 16 to the SRAM 15, and accordingly, the "High" level voltage (VDD: data=1) is applied to the first storage node SNT. In addition, the second storage node SNB of the SRAM 15 is at the "High" level voltage (power supply voltage VDD: data=1) before the SRAM data is programmed into the non-volatile memory unit 16, but the data is inverted by programming the corresponding memory data stored in the non-volatile memory unit 16 to the SRAM 15, and accordingly, the "Low" level voltage (0 V: data=0) is applied to the second storage node SNB.

Then, while an electrical connection between the SRAM 15 and the non-volatile memory unit 16 of the non-volatile SRAM memory cell 2 is blocked by the first drain side select transistor 18a and the second drain side select transistor 18b, the first access transistor 21a and the second access transistor 21b of the SRAM 15 are turned on to send the voltages of the first storage node SNT and the second storage node SNB of the SRAM 15 to the bit information inverting circuit 4 (FIG. 1) through the complementary first bit line BLT1 and the complementary second bit line BLB1.

Then, the bit information inverting circuit 4 generates inverted data ("High" and "Low" level voltages) obtained by inverting the logic of the SRAM data stored in the SRAM 15 through the memory data programming, and applies the inverted data to the SRAM 15 through the complementary first bit line BLT1 and the complementary second bit line BLB1. As a result, in the SRAM 15, the first storage node SNT is at the "Low" level voltage and the second storage node SNB is at the "High" level voltage, thereby achieving a state same as that before the SRAM data is programmed into the non-volatile memory unit 16.

In the above-described embodiment, the logic inversion of the voltage state of the SRAM data stored in the SRAM 15 is performed after the corresponding memory data in the non-volatile memory unit 16 is programmed into the SRAM 15, so that the first storage node SNT and the second storage node SNB of the SRAM 15 are in voltage states same as those before the SRAM data is programmed into the non-volatile memory unit 16. However, the present invention is not limited thereto. For example, the voltage state of the SRAM data in the SRAM 15 may be inverted before the SRAM data is programmed into the non-volatile memory unit 16, and then the inverted SRAM data may be programmed into the non-volatile memory unit 16.

In this case, during the programming operation to program the SRAM data in the SRAM 15 to the non-volatile memory unit 16, the bit information inverting circuit 4 detects the voltages of the first storage node SNT and the second storage node SNB through the complementary first bit line BLT1 and the complementary second bit line BLB1. Then, after the logic inversion, the "Low" level voltage is applied to one of the first storage node SNT and the second storage node SNB, to which the "High" level voltage has been applied, and the "High" level voltage is applied to the other of the first storage node SNT and the second storage node SNB, to which the "Low" level voltage has been applied. In this manner, the SRAM data inverted in advance is stored in the SRAM 15.

Then, the inverted SRAM data in the SRAM 15 is programmed into the non-volatile memory unit 16 of the non-volatile SRAM memory cell 2 to store the inverted SRAM data as memory data in the non-volatile memory unit 16. Thereafter, the memory data in the non-volatile memory unit 16 is programmed into the SRAM 15.

As a result, when the memory data stored in the non-volatile memory unit 16 is programmed into the SRAM 15, for example, the "Low" level voltage (0 V: data=0) is applied to the first storage node SNT of the SRAM 15, to which the "Low" level voltage (0 V: data=0) has been applied before the inverted SRAM data is programmed. Simultaneously, when the memory data stored in the non-volatile memory unit 16 is programmed into the SRAM 15, the "High" level voltage (power supply voltage VDD: data=1) is applied to the second storage node SNB of the SRAM 15, to which the "High" level voltage (the power supply voltage VDD: data=1) has been applied before the inverted SRAM data is programmed.

In this manner, the "High" or "Low" level voltage same as that of the SRAM data stored in the SRAM 15 before the inverted SRAM data is programmed can be applied to each of the first storage node SNT and the second storage node SNB by simply programming, to the SRAM 15, the corresponding memory data stored in the non-volatile memory unit 16 of the non-volatile SRAM memory cell 2.

(8) Operations and Effects

With the above-described configuration, the non-volatile semiconductor memory device 1 according to the present invention includes the non-volatile SRAM memory cell 2 including the SRAM 15 and the non-volatile memory unit 16 connected with each other. The SRAM 15 includes the first load transistor 22a, the first drive transistor 23a, and the first storage node SNT between the first load transistor 22a and the first drive transistor 23a, and includes the second load transistor 22b, the second drive transistor 23b, the second storage node SNB between the second load transistor 22b and the second drive transistor 23b. One end of the first load transistor 22a is connected with one end of the first drive transistor 23a. One end of the second load transistor 22b is connected with one end of the second drive transistor 23b. The other end of each of the first load transistor 22a and the second load transistor 22b is connected with the power supply line VSp1. The other end of each of the first drive transistor 23a and the second drive transistor 23b is connected with the reference voltage line VSn1.

The SRAM 15 includes the first access transistor 21a having one end connected with the gates of the second load transistor 22b and the second drive transistor 23b and with the first storage node SNT, the other end connected with the complementary first bit line BLT1, and the gate connected with the word line WL1. The SRAM 15 also includes the second access transistor 21b having one end connected with the gates of the first load transistor 22a and the first drive transistor 23a and with the second storage node SNB, the other end connected with the complementary second bit line BLB1, and the gate connected with the word line WL1.

The non-volatile memory unit 16 includes the first memory cell 17a and the second memory cell 17b. The first memory cell 17a includes the first memory transistor 19a between the first drain side select transistor 18a and the first source side select transistor 20a connected in series, the first drain side select transistor 18a having one end connected with the first storage node SNT. The second memory cell 17b includes the second memory transistor 19b between the second drain side select transistor 18b and the second source side select transistor 20b connected in series, the second drain side select transistor 18b having one end connected with the second storage node SNB.

In this case, the first memory cell 17a and the second memory cell 17b each include the memory gate structure 44 including the lower gate insulating film 24a, the charge storage layer EC, the upper gate insulating film 24b, and the memory gate electrode MG stacked in this order over the memory well MPW between the drain region 31 and the source region 34. The first memory cell 17a and the second memory cell 17b each include the drain side select gate structure 45 on the first sidewall of the memory gate structure 44 through the sidewall spacer 28a, and include the source side select gate structure 46 on the second sidewall of the memory gate structure 44 through the sidewall spacer 28b.

In the non-volatile SRAM memory cell 2 having such a configuration, only one of the first drain side select transistor 18a and the second drain side select transistor 18b is turned on based on a voltage difference between the first storage node SNT and the second storage node SNB during the programming operation to program, to the non-volatile memory unit 16, SRAM data expressed in a voltage difference between the first storage node SNT and the second storage node SNB of the SRAM 15.

In the non-volatile memory unit 16, for example, when the first storage node SNT is at the "Low" level voltage among the first storage node SNT and the second storage node SNB in the programming operation, the first drain side select transistor 18a, one end of which is connected with the first storage node SNT at the low voltage and to the gate of which the power supply voltage VDD is applied, turned on. Accordingly, in the non-volatile memory unit 16, the "Low" level voltage of the first storage node SNT is applied to the channel layer of the first memory transistor 19a, to the gate of which a high charge storage gate voltage is applied, through the first drain side select transistor 18a, thereby achieving charge injection into the charge storage layer EC of the first memory transistor 19a by the quantum tunneling effect caused by a voltage difference between the gate and the channel layer.

Simultaneously, in the non-volatile memory unit 16, the "High" level voltage of the second storage node SNB is applied to the one end of the second drain side select transistor 18b, to the gate of which the power supply voltage VDD is applied, thereby turning off the second drain side select transistor 18b. The first source side select transistor 20a and the second source side select transistor 20b of the non-volatile memory unit 16 are both turned off to block voltage application to the first memory transistor 19a and the second memory transistor 19b through the source line SL.

Accordingly, the second drain side select transistor 18b and the second source side select transistor 20b of the second memory cell 17b, which are disposed on both sides of the second memory transistor 19b, are both turned off to form the depletion layer D in the memory well MPW facing the memory gate electrode MG of the second memory transistor 19b, to the gate of which the charge storage gate voltage is applied. As a result, in the second memory cell 17b, the potential of the surface of the memory well MPW facing the memory gate electrode MG and surrounded by at least the depletion layer D is increased by the charge storage gate voltage applied to the memory gate electrode MG. Thus, a voltage difference between the memory gate electrode MG and the memory well MPW becomes small enough not to cause the quantum tunneling effect, thereby preventing charge injection into the charge storage layer EC. In this manner, SRAM data stored in the SRAM 15 of the non-volatile SRAM memory cell 2 can be programmed into the non-volatile memory unit 16.

In the programming operation to program the SRAM data stored in the SRAM 15 to the non-volatile memory unit 16 in the non-volatile SRAM memory cell 2, for example, a high charge storage gate voltage of 12 V is applied to the gates of the first memory transistor 19a and the second memory transistor 19b. However, the power supply voltage VDD serves as maximum voltage values applied to the first drain side select transistor 18a and the first source side select transistor 20a of the first memory cell 17a and the second drain side select transistor 18b and the second source side select transistor 20b of the second memory cell 17b. Thus, a voltage needed at the non-volatile memory unit 16 in the programming operation can be reduced accordingly.

In particular, in the non-volatile SRAM memory cell 2, reduction is possible in voltages applied to the first drain side select transistor 18a and the second drain side select transistor 18b of the non-volatile memory unit 16, which are connected with the first storage node SNT of the SRAM 15 or the second storage node SNB in the programming operation. Thus, voltages applied to the first storage node SNT and the second storage node SNB can be reduced accordingly.

As a result, in the non-volatile SRAM memory cell 2, reduction to the power supply voltage VDD or less is possible in maximum voltages applied to the first access transistor 21a, the second access transistor 21b, the first load transistor 22a, the second load transistor 22b, the first drive transistor 23a, and the second drive transistor 23b included in the SRAM 15 connected with the non-volatile memory unit 16. Accordingly, each gate insulating film can have a thickness less than or equal to 4 nm.

Thus, in the non-volatile semiconductor memory device 1 including the non-volatile SRAM memory cell 2, the gate insulating films of the first access transistor 21a, the second access transistor 21b, the first load transistor 22a, the second load transistor 22b, the first drive transistor 23a, and the second drive transistor 23b included in the SRAM 15 can have thicknesses less than or equal to 4 nm. Accordingly, the SRAM 15 can be operated fast at a lower power supply voltage. In this manner, the SRAM data in the SRAM 15 can be programmed into the non-volatile memory unit 16 through fast operation of the SRAM in the non-volatile semiconductor memory device 1.

Since the first storage node SNT and the second storage node SNB have a potential of 0 V or the power supply voltage VDD in the programming operation at the non-volatile memory unit 16, only a gate voltage lower than or equal to the power supply voltage VDD is needed to turn on and off the first drain side select transistor 18a and the second drain side select transistor 18b. This eliminates the need to apply a voltage higher than the power supply voltage VDD, and thus the select gate insulating film 30 of each of the first drain side select transistor 18a and the second drain side select transistor 18b can have a thickness less than or equal to 4 nm.

In addition, only a gate voltage lower than or equal to the power supply voltage VDD is needed to turn off the first source side select transistor 20a and the second source side select transistor 20b in the programming operation at the non-volatile memory unit 16. This eliminates the need to apply a voltage higher than the power supply voltage VDD, and thus the select gate insulating film 33 of each of the first source side select transistor 20a and the second source side select transistor 20b can have a thickness less than or equal to 4 nm.

As described above, the select gate insulating films 30 and 33 of the first drain side select transistor 18a, the second drain side select transistor 18b, the first source side select transistor 20a, and the second source side select transistor 20b of the non-volatile SRAM memory cell 2 can have a thickness less than or equal to 4 nm. Accordingly, the first drain side select transistor 18a, the second drain side select transistor 18b, the first source side select transistor 20a, and the second source side select transistor 20b can achieve improved performance and shorter gate lengths. As a result, the non-volatile memory unit 16 achieves a faster programming operation to program memory data in the non-volatile memory unit 16 to the SRAM 15, and reduction in the cell size thereof.

In the non-volatile semiconductor memory device 1 having the above-described configuration, voltages necessary in the programming operation to program SRAM data in the SRAM 15 to the non-volatile memory unit 16 can be reduced such that the gate insulating films of the first access transistor 21a, the second access transistor 21b, the first load transistor 22a, the second load transistor 22b, the first drive transistor 23a, and the second drive transistor 23b included in the SRAM 15 connected with the non-volatile memory unit 16 can have thicknesses less than or equal to 4 nm. Accordingly, the SRAM 15 can be operated fast at a low power supply voltage, and thus the SRAM data in the SRAM 15 can be programmed into the non-volatile memory unit 16 through fast operation of the SRAM 15.

(9) Other Embodiments

In the above-described embodiment, the common memory gate line MGL is used by the first memory cell 17a and the second memory cell 17b, the common drain side select gate line DGL is used by the first memory cell 17a and the second memory cell 17b, and the common source side select gate line SGL is used by the first memory cell 17a and the second memory cell 17b. However, the present invention is not limited thereto. Different memory gate lines may be used by the first memory cell 17a and the second memory cell 17b, different drain side select gate lines may be used by the first memory cell 17a and the second memory cell 17b, and different source side select gate lines may be used by the first memory cell 17a and the second memory cell 17b.

Alternatively, in the non-volatile semiconductor memory device 1, for example, the common memory gate line MGL may be shared by a plurality of the non-volatile SRAM memory cells 2 arranged in each row, and different memory gate voltages may be applied to the non-volatile SRAM memory cells 2 arranged in the row. In this manner, SRAM data in the SRAMs 15 of the non-volatile SRAM memory cells 2 arranged in the row and connected with the common memory gate line MGL can be programmed into the corresponding non-volatile memory units 16.

In the above-described embodiment, as illustrated in FIG. 3, the first drain side select transistor 18a, the first memory transistor 19a, the first source side select transistor 20a, the second drain side select transistor 18b, the second memory transistor 19b, and the second source side select transistor 20b included in the non-volatile memory unit 16 are disposed in the P-type memory well MPW, whereas the first access transistor 21a, the second access transistor 21b, the first drive transistor 23a, and the second drive transistor 23b among the transistors included in the SRAM 15 are disposed in the same P-type memory well MPW. However, the present invention is not limited thereto. The first drain side select transistor 18a, the first memory transistor 19a, the first source side select transistor 20a, the second drain side select transistor 18b, the second memory transistor 19b, and the second source side select transistor 20b included in the non-volatile memory unit 16 may be disposed in an N-type memory well (for example, the well NW in FIG. 3).

The non-volatile semiconductor memory device 1 according to the present invention is not limited to the above-described voltage values illustrated in FIG. 5. For example, other various voltage values may be used that allow charge injection into the charge storage layers EC of the first memory transistor 19a and the second memory transistor 19b by the quantum tunneling effect or prevent charge injection into these charge storage layers EC through formation of the depletion layer D in the programming operation to program SRAM data in the SRAM 15 to the non-volatile memory unit 16. Moreover, in the external data writing operation to write external data to the SRAM 15, the reading operation to read SRAM data from the SRAM 15, the memory data erasing operation at the non-volatile memory unit 16, and the memory data programming operation to program memory data in the non-volatile memory unit 16 to the SRAM 15, other various voltage values for achieving execution of each operation may be used as the voltage value of each site.

REFERENCE SIGNS LIST 1 non-volatile semiconductor memory device
2 non-volatile SRAM memory cell
15 SRAM
16 non-volatile memory unit
17a first memory cell
17b second memory cell
18a first drain side select transistor
18b second drain side select transistor
19a first memory transistor
19b second memory transistor
20a first source side select transistor
20b second source side select transistor
BLT0, BLT1, BLT2, BLT3 complementary first bit line
BLB0, BLB1, BLB2, BLB3 complementary second bit line
21a first access transistor
21b second access transistor
22a first load transistor
22b second load transistor
23a first drive transistor
23b second drive transistor
EC charge storage layer
VSp0, VSp1, VSp2, VSp3 power supply line
VSn0, VSn1, VSn2, VSn3 reference voltage line

What is claimed is:
1. A non-volatile SRAM memory cell including an SRAM (static random access memory) and a non-volatile memory unit comprising:

the SRAM including a first access transistor, a second access transistor, a first load transistor, a second load transistor, a first drive transistor, and a second drive transistor,
  a first storage node between the first load transistor and the first drive transistor connected in series, one end of the first load transistor being connected with one end of the first drive transistor, and
  a second storage node between the second load transistor and the second drive transistor connected in series, one end of the second load transistor being connected with one end of the second drive transistor,
  wherein the other end of each of the first load transistor and the second load transistor is connected with a power supply line, and the other end of each of the first drive transistor and the second drive transistor is connected with a reference voltage line, and
  the first access transistor has one end connected with the first storage node and with gates of the second load transistor and the second drive transistor, the other end connected with a complementary first bit line, and a gate connected with a word line; and the second access transistor has one end connected with the second storage node and with gates of the first load transistor and the first drive transistor, the other end connected with a complementary second bit line, and a gate connected with the word line,
  the first access transistor, the second access transistor, the first load transistor, the second load transistor, the first drive transistor, and the second drive transistor of the SRAM each include a gate insulating film having a thickness less than or equal to 4 nm, and
the non-volatile memory unit includes a first memory cell and a second memory cell,
  the first memory cell includes: a first drain region connected with the first storage node; a first source region connected with a source line; a first memory gate structure disposed between the first drain region and the first source region and including a first lower memory gate insulating film, a first charge storage layer, a first upper memory gate insulating film, and a first memory gate electrode stacked in this order; a first drain side select gate structure including a first drain side gate insulating film and a first drain side select gate electrode stacked between the first drain region and the first memory gate structure, the first drain side select gate structure being disposed adjacent to a first sidewall of the first memory gate structure, with one first sidewall spacer disposed between the first sidewall of the first memory gate structure and the first drain side select gate structure; and a first source side select gate structure including a first source side gate insulating film and a first source side select gate electrode stacked between the first source region and the first memory gate structure, the first source side select gate structure being disposed adjacent to a second sidewall of the first memory gate structure, with another first sidewall spacer disposed between the second sidewall of the first memory gate structure and the first source side select gate structure,
  the second memory cell includes: a second drain region connected with the second storage node; a second source region connected with the source line; a second memory gate structure disposed between the second drain region and the second source region and including a second lower memory gate insulating film, a second charge storage layer, a second upper memory gate insulating film, and a second memory gate electrode stacked in this order; a second drain side select gate structure including a second drain side gate insulating film and a second drain side select gate electrode stacked between the second drain region and the second memory gate structure, the second drain side select gate structure being disposed adjacent to a first sidewall of the second memory gate structure, with one second sidewall spacer disposed between the first sidewall of the second memory gate structure and the second drain side select gate structure; and a second source side select gate structure including a second source side gate insulating film and a second source side select gate electrode stacked between the second source region and the second memory gate structure, the second source side select gate structure being disposed adjacent to a second sidewall of the second memory gate structure, with another second sidewall spacer disposed between the second sidewall of the second memory gate structure and the second source side select gate structure, wherein
  the one first sidewall spacer, the other first sidewall spacer, the one second sidewall spacer, and the other second sidewall spacer each have a width more than or equal to 5 nm, and the first drain side gate insulating film, the first source side gate insulating film, the second drain side gate insulating film, and the second source side gate insulating film each have a thickness less than or equal to 4 nm.

2. The non-volatile SRAM memory cell according to claim 1, wherein
  the first charge storage layer is not disposed in the one first sidewall spacer and the other first sidewall spacer, and the second charge storage layer is not disposed in the one second sidewall spacer and the other second sidewall spacer.

3. The non-volatile SRAM memory cell according to claim 1, wherein
  the first load transistor and the second load transistor are arranged in an N-type well, and
  the first access transistor, the second access transistor, the first drive transistor, the second drive transistor, and the non-volatile memory unit are arranged in a P-type well disposed adjacent to the N-type well.

4. The non-volatile SRAM memory cell according to claim 1, further comprising:
  a drain side select gate line connected with the first drain side select gate electrode and the second drain side select gate electrode,
  a source side select gate line connected with the first source side select gate electrode and the second source side select gate electrode, and
  a memory gate line connected with the first memory gate electrode and the second memory gate electrode.

5. A non-volatile semiconductor memory device comprising the non-volatile SRAM memory cells according to claim 4, the non-volatile SRAM memory cells being disposed in a matrix of rows and columns, wherein
  the source line, the drain side select gate line, and the source side select gate line are shared by the non-volatile SRAM memory cells.

6. A non-volatile SRAM memory cell including an SRAM (Static Random Access Memory) and a non-volatile memory unit comprising:

the SRAM including a first access transistor, a second access transistor, a first load transistor, a second load transistor, a first drive transistor, and a second drive transistor,
- a first storage node between the first load transistor and the first drive transistor connected in series, one end of the first load transistor being connected with one end of the first drive transistor, and
- a second storage node between the second load transistor and the second drive transistor connected in series, one end of the second load transistor being connected with one end of the second drive transistor,
- wherein the other end of each of the first load transistor and the second load transistor is connected with a power supply line, and the other end of each of the first drive transistor and the second drive transistor is connected with a reference voltage line, and
- the first access transistor has one end connected with the first storage node and with gates of the second load transistor and the second drive transistor, the other end connected with a complementary first bit line, and a gate connected with a word line; and the second access transistor has one end connected with the second storage node and with gates of the first load transistor and the first drive transistor, the other end connected with a complementary second bit line, and a gate connected with the word line, and the non-volatile memory unit including a first memory cell and a second memory cell, the first memory cell including a first drain side select transistor, a first source side select transistor, and a first memory transistor between the first drain side select transistor and the first source side select transistor connected in series, the first drain side select transistor having one end connected with the first storage node, the second memory cell including a second drain side select transistor, a second source side select transistor, and a second memory transistor between the second drain side select transistor and the second source side select transistor connected in series, the second drain side select transistor having one end connected with the second storage node, the first source side select transistor and the second source side select transistor each having one end connected with a source line, and
- the first memory transistor and the second memory transistor each including a charge storage layer into which charge is injected by a quantum tunneling effect that occurs in accordance with a charge storage gate voltage applied to a memory gate electrode,
wherein in the SRAM, the first access transistor, the second access transistor, the first load transistor, the second load transistor, the first drive transistor, and the second drive transistor each include a gate insulating film having a thickness less than or equal to 4 nm, and in the non-volatile memory unit, neither the drain region nor the source region is formed between the first drain side select transistor and the first memory transistor, and between the first source side select transistor and the first memory transistor, and between the second drain side select transistor and the second memory transistor, and between the second source side select transistor and the second memory transistor, and when charge is to be injected into the charge storage layer of any one of the first memory transistor and the second memory transistor, a voltage of 0 V is applied to the source line and a voltage of 0 V is applied to a gate of the first source side select transistor and to a gate of the second source side select transistor to turn off the first source side select transistor and the second source side select transistor while a power supply voltage VDD less than or equal to 1.5 V is applied to a gate of the first drain side select transistor and a gate of the second drain side select transistor to turn on one of the first drain side select transistor and the second drain side select transistor due to a voltage difference between the first storage node and the second storage node so that a voltage at the first storage node or the second storage node is applied to the first memory transistor or the second memory transistor through any one of the first drain side select transistor or the second drain side select transistor, so as to allow charge injection into the charge storage layer of one of the first memory transistor and the second memory transistor by the quantum tunneling effect while charge injection into the charge storage layer of the other of the first memory transistor and the second memory transistor is prevented.

7. The non-volatile SRAM memory cell according to claim 6, wherein, when charge is to be injected into the charge storage layer of one of the first memory transistor and the second memory transistor while charge injection into the charge storage layer of the other of the first memory transistor and the second memory transistor is prevented, a voltage of 0 V is applied to the source line and a voltage of 0 V is applied to the gate of the first source side select transistor and to the gate of the second source side select transistor to turn off the first source side select transistor and the second source side select transistor while a power supply voltage VDD less than or equal to 1.5 V is applied to the gates of the first and the second drain side select transistors to turn off one of the first drain side select transistor and the second drain side select transistor that prevent the charge injection into the charge storage layer, due to a voltage difference between the first storage node and the second storage node, so that a depletion layer is formed in a memory well facing the memory gate electrode in any one of the second memory transistor and the first memory transistor while a potential of at least a surface of the memory well is increased in accordance with the charge storage gate voltage applied to the memory gate electrode, so as to reduce a voltage difference between the memory gate electrode and the surface of the memory well to prevent the charge injection into the charge storage layer.

8. The non-volatile SRAM memory cell according to claim 7, wherein
- when the depletion layer is formed in the first memory cell, the depletion layer prevents the potential of the memory well of the first memory transistor from being applied to a select gate insulating film of each of the first drain side select transistor and the first source side select transistor, and
- when the depletion layer is formed in the second memory cell, the depletion layer prevents the potential of the memory well of the second memory transistor from being applied to a select gate insulating film of each of the second drain side select transistor and the second source side select transistor.

9. A non-volatile semiconductor memory device comprising the non-volatile SRAM memory cells according to claim 6, the non-volatile SRAM memory cells being disposed in a matrix of rows and columns.

* * * * *